(12) United States Patent
Shitagaki et al.

(10) Patent No.: US 9,741,955 B2
(45) Date of Patent: Aug. 22, 2017

(54) LIGHT-EMITTING ELEMENT, LIGHT-EMITTING DEVICE, AND METHOD FOR MANUFACTURING THE SAME

(75) Inventors: Satoko Shitagaki, Kanagawa (JP); Tsunenori Suzuki, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1176 days.

(21) Appl. No.: 12/788,004

(22) Filed: May 26, 2010

(65) Prior Publication Data

US 2010/0301383 A1    Dec. 2, 2010

(30) Foreign Application Priority Data

May 29, 2009 (JP) ................................. 2009-131571

(51) Int. Cl.
    *H01L 51/52* (2006.01)
    *H01L 51/50* (2006.01)
    *H01L 51/00* (2006.01)

(52) U.S. Cl.
    CPC ...... *H01L 51/5036* (2013.01); *H01L 51/5052* (2013.01); *H01L 51/0059* (2013.01); *H01L 51/0072* (2013.01); *H01L 51/0081* (2013.01); *H01L 2251/552* (2013.01)

(58) Field of Classification Search
    None
    See application file for complete search history.

(56) References Cited

U.S. PATENT DOCUMENTS

| | | |
|---|---|---|
| 6,285,039 B1 | 9/2001 | Kobori et al. |
| 6,528,188 B1 | 3/2003 | Suzuki et al. |
| 6,603,140 B2 | 8/2003 | Kobori et al. |
| 6,867,538 B2 | 3/2005 | Adachi et al. |
| 6,951,694 B2 | 10/2005 | Thompson et al. |

(Continued)

FOREIGN PATENT DOCUMENTS

| | | |
|---|---|---|
| EP | 0 857 007 A1 | 8/1998 |
| EP | 1 342 769 A1 | 9/2003 |

(Continued)

OTHER PUBLICATIONS

International Search Report re application No. PCT/JP2010/059398, dated Sep. 14, 2010.

(Continued)

*Primary Examiner* — J. L. Yang
(74) *Attorney, Agent, or Firm* — Husch Blackwell LLP

(57) ABSTRACT

An object is to provide a light-emitting element with high emission efficiency. Another object is to provide a light-emitting element with a long lifetime and high reliability. Another object is to provide a light-emitting element driven at low voltage. A first light-emitting layer whose one surface is in contact with a hole-transport layer, and a second light-emitting layer which is in contact with the other surface of the first light-emitting layer and includes a bipolar host material and a light-emitting substance are provided, where the hole-transport property of the first light-emitting layer is higher than that of the second light-emitting layer. A recombination region of holes and electrons is preferably provided in the light-emitting layer. The hole-transport layer preferably includes an anti-reducing substance.

17 Claims, 17 Drawing Sheets

(56) References Cited

U.S. PATENT DOCUMENTS

| | | |
|---|---|---|
| 7,158,161 B2 | 1/2007 | Gyoutoku et al. |
| 7,387,904 B2 | 6/2008 | Saito et al. |
| 7,462,883 B2 | 12/2008 | Kumaki et al. |
| 7,521,855 B2 | 4/2009 | Sakata et al. |
| 7,545,840 B2 | 6/2009 | Yukawa |
| 7,605,534 B2 | 10/2009 | Yamazaki et al. |
| 7,626,198 B2 | 12/2009 | Hirakata et al. |
| 7,649,197 B2 | 1/2010 | Iwaki et al. |
| 7,649,211 B2 | 1/2010 | Ohsawa |
| 7,667,389 B2 | 2/2010 | Ikeda et al. |
| 7,683,532 B2 | 3/2010 | Abe et al. |
| 7,714,501 B2 | 5/2010 | Nomura et al. |
| 7,732,061 B2 | 6/2010 | Nomura et al. |
| 7,960,912 B2 | 6/2011 | Yasukawa et al. |
| 8,007,927 B2 | 8/2011 | Lin et al. |
| 8,143,613 B2 | 3/2012 | Forrest |
| 8,221,905 B2 | 7/2012 | Lin et al. |
| 8,367,850 B2 | 2/2013 | Ma et al. |
| 8,580,402 B2 | 11/2013 | Lin et al. |
| 8,586,204 B2 | 11/2013 | Xia et al. |
| 8,653,537 B2 | 2/2014 | He et al. |
| 9,000,419 B2 | 4/2015 | Iizumi et al. |
| 2002/0025419 A1* | 2/2002 | Lee et al. ............. 428/212 |
| 2002/0038867 A1 | 4/2002 | Kobori et al. |
| 2002/0093283 A1 | 7/2002 | Seo et al. |
| 2002/0101154 A1 | 8/2002 | Seo et al. |
| 2002/0121860 A1 | 9/2002 | Seo et al. |
| 2002/0139303 A1 | 10/2002 | Yamazaki et al. |
| 2003/0020073 A1* | 1/2003 | Long et al. ............. 257/79 |
| 2004/0161192 A1 | 8/2004 | Hamano et al. |
| 2004/0197601 A1* | 10/2004 | Thompson et al. ....... 428/690 |
| 2005/0084712 A1 | 4/2005 | Kido et al. |
| 2005/0116633 A1 | 6/2005 | Yamazaki et al. |
| 2005/0170208 A1 | 8/2005 | Yatsunami et al. |
| 2006/0008740 A1 | 1/2006 | Kido et al. |
| 2006/0046096 A1 | 3/2006 | Nomura et al. |
| 2006/0057427 A1 | 3/2006 | Tsukahara et al. |
| 2006/0066231 A1* | 3/2006 | Nishikawa et al. ....... 313/506 |
| 2006/0105201 A1* | 5/2006 | Lee et al. ............. 428/690 |
| 2006/0118166 A1 | 6/2006 | Iwaki |
| 2006/0180812 A1 | 8/2006 | Sakata et al. |
| 2006/0228822 A1 | 10/2006 | Hayakawa et al. |
| 2006/0232203 A1 | 10/2006 | Noda |
| 2006/0241202 A1* | 10/2006 | Wallace ................. 523/1 |
| 2006/0243967 A1 | 11/2006 | Nomura et al. |
| 2006/0250076 A1 | 11/2006 | Hofmann et al. |
| 2006/0263638 A1 | 11/2006 | Kawakami et al. |
| 2006/0270066 A1 | 11/2006 | Imahayashi et al. |
| 2006/0284189 A1 | 12/2006 | Sakata et al. |
| 2006/0284204 A1 | 12/2006 | Yamazaki et al. |
| 2006/0292394 A1 | 12/2006 | Iwaki et al. |
| 2007/0000487 A1 | 1/2007 | Sakata |
| 2007/0001570 A1 | 1/2007 | Nomura et al. |
| 2007/0007516 A1 | 1/2007 | Seo et al. |
| 2007/0013295 A1 | 1/2007 | Matsuura et al. |
| 2007/0013301 A1 | 1/2007 | Yamazaki et al. |
| 2007/0029929 A1 | 2/2007 | Nakamura et al. |
| 2007/0085106 A1 | 4/2007 | Kawakami et al. |
| 2007/0150206 A1 | 6/2007 | Iwaki et al. |
| 2007/0172699 A1 | 7/2007 | Nakashima et al. |
| 2007/0194306 A1 | 8/2007 | Yamazaki et al. |
| 2007/0194692 A1* | 8/2007 | Nomura et al. .......... 313/503 |
| 2007/0200125 A1 | 8/2007 | Ikeda et al. |
| 2007/0210322 A1 | 9/2007 | Ohsawa et al. |
| 2008/0008905 A1 | 1/2008 | Yamazaki |
| 2008/0017853 A1 | 1/2008 | Egawa et al. |
| 2008/0203406 A1 | 8/2008 | He et al. |
| 2008/0210960 A1 | 9/2008 | Ha et al. |
| 2008/0246028 A1 | 10/2008 | Ikeda et al. |
| 2008/0308794 A1 | 12/2008 | Ibe et al. |
| 2009/0001879 A1 | 1/2009 | Ikeda et al. |
| 2009/0001886 A1 | 1/2009 | Ibe et al. |
| 2009/0004506 A1 | 1/2009 | Nomura et al. |
| 2009/0102368 A1 | 4/2009 | Shitagaki et al. |
| 2009/0153034 A1 | 6/2009 | Lin et al. |
| 2009/0165854 A1 | 7/2009 | Yamazaki et al. |
| 2009/0200918 A1 | 8/2009 | Seo et al. |
| 2009/0208776 A1* | 8/2009 | Liu et al. ............ 428/690 |
| 2009/0236590 A1 | 9/2009 | Ohsawa |
| 2009/0278445 A1 | 11/2009 | Jen et al. |
| 2010/0059741 A1 | 3/2010 | Ohsawa et al. |
| 2010/0096622 A1 | 4/2010 | Iizumi et al. |
| 2010/0123152 A1 | 5/2010 | Sugisawa et al. |
| 2010/0193776 A1 | 8/2010 | Kinoshita et al. |
| 2010/0301382 A1 | 12/2010 | Shitagaki et al. |
| 2011/0057171 A1 | 3/2011 | Adamovich et al. |
| 2011/0057178 A1* | 3/2011 | Shitagaki et al. ......... 257/40 |
| 2011/0084599 A1 | 4/2011 | Brooks et al. |
| 2011/0215301 A1 | 9/2011 | Forrest |
| 2013/0175510 A1 | 7/2013 | Ma et al. |

FOREIGN PATENT DOCUMENTS

| | | |
|---|---|---|
| EP | 1 524 706 A2 | 4/2005 |
| EP | 1 530 245 A2 | 5/2005 |
| EP | 1 713 136 A1 | 10/2006 |
| EP | 1 901 364 A1 | 3/2008 |
| EP | 1 947 698 A2 | 7/2008 |
| EP | 1 992 672 A1 | 11/2008 |
| EP | 2 117 063 A1 | 11/2009 |
| EP | 2 511 254 A2 | 10/2012 |
| JP | 04-297076 A | 10/1992 |
| JP | 9-63771 | 3/1999 |
| JP | 11-307259 | 11/1999 |
| JP | 2000-068057 A | 3/2000 |
| JP | 2001-155860 A | 6/2001 |
| JP | 2005-011734 A | 1/2005 |
| JP | 2005-26121 | 1/2005 |
| JP | 2005-038672 A | 2/2005 |
| JP | 2005-108572 A | 4/2005 |
| JP | 2005-108730 A | 4/2005 |
| JP | 2005-190998 | 7/2005 |
| JP | 2006-279014 | 10/2006 |
| JP | 2006-295192 | 10/2006 |
| JP | 2007-294261 | 11/2007 |
| JP | 2008-509565 | 3/2008 |
| JP | 2008-198801 | 8/2008 |
| JP | 2008-204934 | 9/2008 |
| JP | 2009-032977 A | 2/2009 |
| JP | 2009-81447 | 4/2009 |
| JP | 2009-093810 A | 4/2009 |
| JP | 2009-103523 A | 5/2009 |
| JP | 2009-117823 | 5/2009 |
| JP | 2010-515255 | 5/2010 |
| TW | 200608608 | 3/2006 |
| TW | 200847837 | 12/2008 |
| WO | WO 02/071813 A1 | 9/2002 |
| WO | WO 2006/015567 A1 | 2/2006 |
| WO | WO 2006/059734 A1 | 6/2006 |
| WO | WO 2006/100889 A1 | 9/2006 |
| WO | WO 2007/004563 A1 | 1/2007 |
| WO | WO 2007/111192 A2 | 10/2007 |
| WO | WO 2007/133633 A2 | 11/2007 |
| WO | WO 2008/102644 A1 | 8/2008 |
| WO | WO 2009/017210 A1 | 2/2009 |
| WO | WO 2009/021107 A1 | 2/2009 |
| WO | WO 2009/021126 A2 | 2/2009 |
| WO | WO 2009/030981 A2 | 3/2009 |
| WO | WO 2009/051248 A1 | 4/2009 |
| WO | WO 2009/070382 A1 | 6/2009 |
| WO | WO 2009/085344 A2 | 7/2009 |
| WO | WO 2009/086028 A2 | 7/2009 |

OTHER PUBLICATIONS

Written Opinion re application No. PCT/JP2010/059398, dated Sep. 14, 2010.

Tsutsui, T. et al., "High Quantum Efficiency in Organic Light-Emitting Devices with Iridium-Complex as a Triplet Emissive Center", Jpn. J. Appl. Phys., vol. 38, Part 2, No. 12B, Dec. 15, 1999, pp. L1502-L1504.

(56) References Cited

OTHER PUBLICATIONS

Goldsmith, C.R. et al., "C—H Bond Activation by a Ferric Methoxide Complex: Modeling the Rate-Determining Step in the Mechanism of Lipoxygenase," J. Am. Chem. Soc., vol. 124, No. 1, 2002, pp. 83-96.

Onishi, T. et al, "A Method of Measuring an Energy Level," *High Molecular EL Materials Development of Light-Emitting High Molecular Compounds*, Kyoritsu Shuppan, Dec. 25, 2004, p. 64-67 (with English translation, pp. 1-3).

Search Report re European application No. EP 10780686.1, dated May 22, 2013.

Taiwanese Office Action re Application No. TW 099117034, dated Jul. 20, 2015.

European Office Action re Application No. EP 10780686.1, dated Jun. 27, 2016.

\* cited by examiner

LIGHT-EMITTING ELEMENT, LIGHT-EMITTING DEVICE, AND METHOD FOR MANUFACTURING THE SAME

TECHNICAL FIELD

The present invention relates to a light-emitting element, a light-emitting device, and a method for manufacturing thereof.

BACKGROUND ART

In recent years, research and development have been extensively conducted on light-emitting elements using electroluminescence. Such a light-emitting element has a structure where a layer including a substance with a light-emitting property is interposed between a pair of electrodes. By application of voltage between the pair of electrodes, light emission can be obtained from the substance with a light-emitting property.

There are various possible applications of such a self-luminous light-emitting element. For example, such a self-luminous light-emitting element is preferably used for a flat panel display element because of having advantages such as high visibility of pixels as compared to a liquid crystal display and no backlight required. Further, it also has great features and advantages that such a self-luminous light-emitting element can be manufactured to be thin and lightweight and has very high response speed with respect to an input signal.

Furthermore, since such a light-emitting element can be formed in a film form, a planar light-emitting device with a large area can be easily formed. This is a feature which is difficult to be obtained in point light sources typified by an incandescent lamp and an LED or line light sources typified by a fluorescent bulb. In addition, such a light-emitting element has attracted attention as a next-generation lighting device because it is estimated to have higher emission efficiency than filament bulbs or fluorescent bulbs.

The light-emitting elements using electroluminescence are roughly classified in accordance with whether they include an organic compound or an inorganic compound as a substance with a light-emitting property. The light-emitting element using electroluminescence which includes an organic compound as a substance with a light-emitting property emits light in the following manner. First, voltage is applied to a first electrode and a second electrode which constitute a pair of electrodes, so that electrons and holes are transported to a light-emitting layer including a substance with a light-emitting property. The electrons and holes are recombined in the light-emitting layer and energy is generated. The substance with a light-emitting property included in the light-emitting layer is excited by the energy. When the excited substance with a light-emitting property returns to a ground state, light is emitted.

Such a light-emitting element which emits light by the transport of electrons and holes to the light-emitting layer is called a current excitation type light-emitting element. Note that the excited state of an organic compound can be a singlet excited state or a triplet excited state, and light emission from the singlet excited state is referred to as fluorescence, and light emission from the triplet excited state is referred to as phosphorescence.

In improving element characteristics of such a light-emitting element, there are many problems which depend on substances. Therefore, improvement in an element structure, development of a substance, and the like have been carried out in order to solve the problems. In terms of improving efficiency, it is preferable that the light-emitting element be in a state where the numbers of electrons and holes which are transported to the light-emitting layer are balanced, i.e., a state where the balance of carriers is achieved, and a state where the transported electrons and holes are successively recombined and thus energy is generated, for example.

As an example of a method for achieving the balance of carriers in the light-emitting element, there is a method for achieving the balance of carriers transported to the light-emitting layer by the control of materials and thicknesses of a hole-transport layer provided between an anode and the light-emitting layer in the light-emitting element, and an electron-transport layer provided between the light-emitting layer and a cathode in the light-emitting element.

Further, in Non-Patent Document 1, a method for preventing holes from leaking from a light-emitting layer to a cathode side with the use of a hole-blocking layer provided between the light-emitting layer and the cathode is disclosed. The holes are trapped in the light-emitting layer, whereby the recombination of the electrons and the holes in the light-emitting layer is facilitated. As a result, the emission efficiency of a phosphorescent light-emitting substance is successfully increased.

CITATION LIST

Non-Patent Document

[Non-Patent Document 1]
Tetsuo TSUTSUI, and et al., *Japanese Journal of Applied Physics*, vol. 38, L1502-L1504 (1999)

DISCLOSURE OF INVENTION

The numbers of holes and electrons which are transported to a light-emitting layer is influenced by various factors such as the selection of a material, a thickness, and an interface state of layers included in a light-emitting element. Therefore, it is difficult to achieve and maintain the balance of carriers.

In a state where the numbers of electrons and holes which are transported to the light-emitting layer are not balanced, some of the holes transported from a hole-transport layer side might pass through the light-emitting layer and reach an electron-transport layer, or some of the electrons transported from an electron-transport layer side might pass through the light-emitting layer and reach the hole-transport layer.

Carriers which have passed from one side of the light-emitting layer to the other side without recombination might cause the decrease in emission efficiency and the decrease in reliability of the light-emitting element. Further, in the case where a carrier blocking layer is used in order to trap carriers in the light-emitting layer, the trapped carriers might serve as quenchers, resulting in the decrease in emission efficiency. For example, in the case where a hole blocking layer is provided in contact with the cathode side of the light-emitting layer so that holes are trapped in the light-emitting layer, cations might be produced due to excessive holes in the vicinity of the interface between the light-emitting layer and the hole blocking layer. Since the produced cations often serve as quenchers, emission efficiency of the element is diminished. Further, holes which have passed through the light-emitting layer and have reached the electron-transport layer might oxidize the electron-transport layer, resulting in deterioration in the electron-transport layer. Electrons which have passed through the light-emitting layer and have reached the hole-transport layer might reduce the hole-transport layer, resulting in deterioration in the hole-transport layer.

It is an object of an embodiment of the present invention to provide a light-emitting element with high emission efficiency. It is an object to provide a highly reliable light-emitting element whose luminance is not decreased easily. It is an object to provide a light-emitting element which is driven at low voltage.

A light-emitting element including at least a first light-emitting layer whose one side is in contact with a hole-transport layer and a second light-emitting layer which is in contact with the other side of the first light-emitting layer is provided. A bipolar host material and a guest material which is a light-emitting substance are included in each of the first light-emitting layer and the second light-emitting layer. Further, the first light-emitting layer whose hole-transport property is higher than that of the second light-emitting layer is provided, so that holes may be transported into a light-emitting layer including the first light-emitting layer and the second light-emitting layer, and a recombination region of holes and electrons may be provided in the light-emitting layer. Furthermore, an anti-reducing substance may be included in the hole-transport layer so that the hole-transport layer is not reduced by electrons passing through the light-emitting layer and reaching the hole-transport layer.

That is, an embodiment of the present invention is a light-emitting element including a hole-transport layer, a light-emitting layer, and an electron-transport layer between a first electrode and a second electrode. In the light-emitting element, the light-emitting layer is provided between the hole-transport layer and the electron-transport layer; a first light-emitting layer in contact with the hole-transport layer and a second light-emitting layer in contact with the first light-emitting layer are included in the light-emitting layer; the first light-emitting layer and the second light-emitting layer are bipolar; a hole-transport property of the first light-emitting layer is higher than a hole-transport property of the second light-emitting layer; a light-emitting substance is included in each of the first light-emitting layer and the second light-emitting layer; and a first organic compound and an anti-reducing substance are included in the hole-transport layer.

An embodiment of the present invention is the above-described light-emitting element where a light-emitting substance and a host material are included in each of the first light-emitting layer and the second light-emitting layer, where a difference between a HOMO level of the light-emitting substance included in the first light-emitting layer ($HOMO_{EM1}$) and a HOMO level of the light-emitting substance included in the second light-emitting layer ($HOMO_{EM2}$) is less than or equal to 0.2 (eV), where a difference between a HOMO level of the host material included in the second light-emitting layer ($HOMO_{HOST2}$) and a HOMO level of the host material included in the first light-emitting layer ($HOMO_{HOST1}$) is less than or equal to 0.2 (eV), and where the HOMO level of the light-emitting substance included in the first light-emitting layer ($HOMO_{EM1}$) is shallower than the HOMO level of the host material included in the first light-emitting layer ($HOMO_{HOST1}$).

An embodiment of the present invention is the above-described light-emitting element where the first light-emitting layer and the second light-emitting layer are formed including the same light-emitting substances.

An embodiment of the present invention is the above-described light-emitting element where the first light-emitting layer and the second light-emitting layer are formed including same host materials.

An embodiment of the present invention is the above-described light-emitting element where a concentration $C_2$ of the light-emitting substance included in the second light-emitting layer is higher than a concentration $C_1$ of the light-emitting substance included in the first light-emitting layer.

An embodiment of the present invention is the above-described light-emitting element where a third light-emitting layer is provided between the second light-emitting layer and the electron-transport layer, and where a light-emitting substance is included in the third light-emitting layer.

An embodiment of the present invention is the above-described light-emitting element where a metal oxide is included in the hole-transport layer as the anti-reducing substance.

An embodiment of the present invention is the above-described light-emitting element where the anti-reducing substance is an organic compound, where a LUMO level (lowest unoccupied molecular orbital level) of the organic compound ($LUMO_{URM}$) is deeper than a LUMO level of the host material included in the first light-emitting layer ($LUMO_{HOST1}$), where a band gap of the organic compound, $\Delta E_{URM}$, is wider than a band gap of the light-emitting substance included in the first light-emitting layer, $\Delta E_{EM1}$, and where a HOMO level of the organic compound ($HOMO_{URM}$) is deeper than a HOMO level of the first organic compound included in the hole-transport layer ($HOMO_{HTL}$).

An embodiment of the present invention is the above-described light-emitting element where the anti-reducing substance is included in the hole-transport layer and where the hole-transport layer is in direct contact with an anode.

With the above structure, at least one of the above objects can be achieved.

Note that in this specification, a bipolar material refers to a material which is capable of an oxidation (a reaction in which electrons are taken) and a reduction (a reaction in which electrons are received) in an EL layer and is comparatively stable with respect to both reactions (being stable after both reactions).

Note that in this specification, an anti-reducing substance refers to a material which protects a coexisting material from a reduction and also, for example, which is reduced more easily (which receives electrons more easily) than a coexisting organic material in an EL layer and which is stable with respect to a reduction (which is stable in a state of being reduced). A reduction refers to a reaction in which electrons are received. Further, in this specification, the term "composite" does not simply mean a state in which two materials are mixed but also mean a state in which electric charges can be given and received between a plurality of materials by mixing of the plurality of materials. In addition, a composite material refers to a material which is in such a state.

In this specification, an EL layer refers to a layer provided between a pair of electrodes in a light-emitting element. Therefore, a light-emitting layer interposed between electrodes is an embodiment of an EL layer.

In this specification, in the case where a substance A is dispersed in a matrix formed using a substance B, the substance B forming the matrix is referred to as a host material, and the substance A dispersed in the matrix is referred to as a guest material. Note that the substance A and the substance B may each be a single substance or a mixture of two or more kinds of substances.

Note that in this specification, a light-emitting device refers to an image display unit, a light-emitting unit, or a light source (including a lighting device). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module having an IC (integrated circuit) directly mounted on a substrate over which a light-emitting element is formed by a COG (chip on glass) method.

According to the present invention, a light-emitting element with high emission efficiency can be provided. Further, a highly reliable light-emitting element whose luminance is not decreased easily can be provided. Furthermore, a light-emitting element which is driven at low voltage can be provided.

BEST MODE FOR CARRYING OUT THE INVENTION

Embodiments of the present invention are described below with reference to drawings. However, the present invention is not limited to the description given below, and it will be readily apparent to those skilled in the art that various changes and modifications in modes and details thereof can be made without departing from the purpose and scope of the present invention. Therefore, the present invention should not be interpreted as being limited to the description of Embodiments given below.

Embodiment 1

A light-emitting element which is illustrated in Embodiment 1 includes at least a first light-emitting layer whose one side is in contact with a hole-transport layer and a second light-emitting layer which is in contact with the other side of the first light-emitting layer. The first light-emitting layer and the second light-emitting layer each include a bipolar host material and a guest material which is a light-emitting substance, and the hole-transport property of the first light-emitting layer is higher than that of the second light-emitting layer. Further, an anti-reducing substance is included in the hole-transport layer so that the hole-transport layer is not reduced by electrons passing through the light-emitting layer and reaching the hole-transport layer.

Figure 1A:
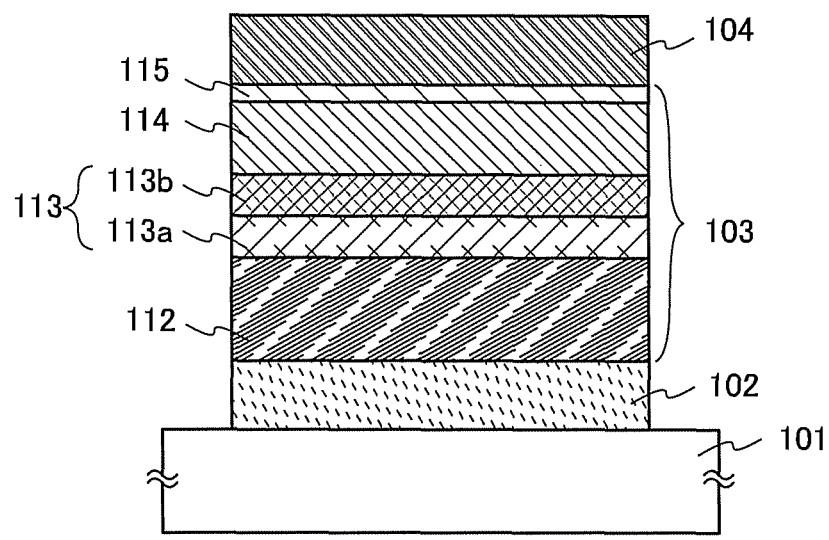
FIGS. 1A and 1B illustrate a light-emitting element according to Embodiment.

FIG. 1A illustrates the structure of the light-emitting element of Embodiment 1. The light-emitting element of Embodiment 1 includes a first electrode 102, a second electrode 104, and an EL layer 103. The first electrode 102 is formed over a glass substrate 101 and serves as an anode in Embodiment 1. The EL layer 103 includes at least a hole-transport layer 112, a first light-emitting layer 113a, a second light-emitting layer 113b, and an electron-transport layer 114, and further, an electron-injection layer 115 or the like is combined as appropriate. The hole-transport layer 112 is provided between the first electrode 102 serving as an anode and the first light-emitting layer 113a and is in contact with a side on the anode side of the first light-emitting layer 113a. The second light-emitting layer 113b is provided between the first light-emitting layer 113a and the second electrode 104 serving as a cathode and is in contact with a side on the cathode side of the first light-emitting layer 113a. The electron-transport layer 114 is provided between the second light-emitting layer 113b and the second electrode 104 serving as a cathode and is in contact with a side on the cathode side of the second light-emitting layer 113b. The second electrode 104 serves as a cathode, and the electron-injection layer 115 is provided between the electron-transport layer 114 and the second electrode 104.

Figure 1B:
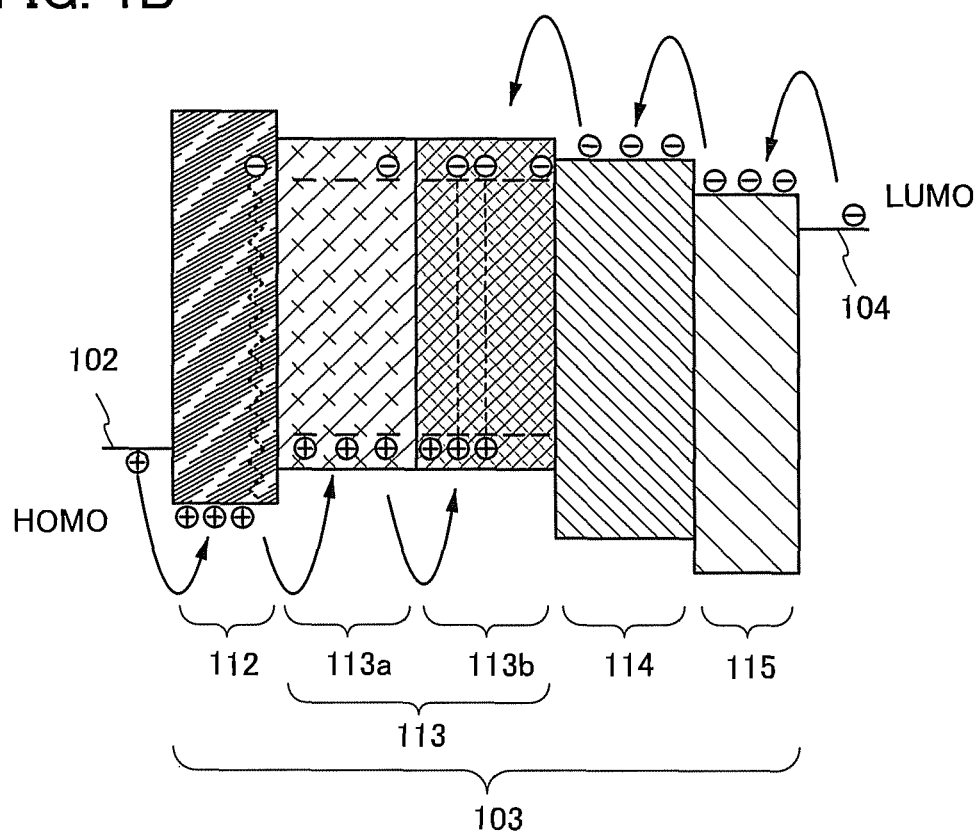

Next, the behavior of carriers in the light-emitting element of Embodiment 1 is described. FIG. 1B is a band diagram illustrating the correlation of bands of layers in the EL layer of the light-emitting element illustrated in Embodiment 1.

First, the behavior of holes which move in the EL layer is described.

The hole-transport layer 112 of Embodiment 1 includes a first organic compound and an anti-reducing substance and has a high hole-transport property. It is preferable that the HOMO level of the first organic compound ($HOMO_{HTL}$) be deeper than (the absolute value of the HOMO level thereof be larger than that of) the HOMO level of the host material included in the first light-emitting layer 113a ($HOMO_{HOST1}$), because injection of holes from the hole-transport layer 112 to the first light-emitting layer 113a is facilitated and the light-emitting element can be driven at lower voltage. Further, the hole-transport layer 112 formed using a composite material layer including an acceptor substance as an anti-reducing substance can also serve as a hole-injection layer, whereby the structure of the light-emitting element is made simpler. Note that a structure in which a hole-injection layer is interposed between the first electrode 102 serving as an anode and the hole-transport layer 112 may be used.

The first light-emitting layer 113a and the second light-emitting layer 113b each include a host material and a guest material and can transport holes and electrons. The hole-transport property of the first light-emitting layer 113a is higher than the hole-transport property of the second light-emitting layer 113b. With such a structure, holes can be transported from the anode side into the light-emitting layer 113. Moreover, a phenomenon in which the holes pass through the light-emitting layer 113 and reach the electron-transport layer 114 which is on the cathode side can be suppressed.

Note that the host materials of the first light-emitting layer 113a and the second light-emitting layer 113b may be either the same or different. At least, the host materials are bipolar and are stable with respect to an oxidation and a reduction. In addition, light-emitting substances are included in the first light-emitting layer 113a and the second light-emitting layer 113b as the guest materials. The light-emitting substances included in the first light-emitting layer 113a and the second light-emitting layer 113b may be either the same or different. Preferably, the highest occupied molecular orbital levels (HOMO levels) of the light-emitting substances included in the first light-emitting layer 113a and the second light-emitting layer 113b are shallower than those of the host materials included in the first light-emitting layer 113a and the second light-emitting layer 113b.

In Embodiment 1, the relationship among the HOMO level of the host material included in the first light-emitting layer 113a ($HOMO_{HOST1}$), the HOMO level of the light-emitting substance included in the first light-emitting layer 113a ($HOMO_{EM1}$), the HOMO level of the host material included in the second light-emitting layer 113b ($HOMO_{HOST2}$), and the HOMO level of the light-emitting substance included in the second light-emitting layer 113b ($HOMO_{EM2}$) is as follows: $HOMO_{HOST2}$ is deeper than or equal to $HOMO_{HOST1}$ (the absolute value of $HOMO_{HOST2}$ is larger than or equal to the absolute value of $HOMO_{HOST1}$); $HOMO_{HOST1}$ is deeper than $HOMO_{EM1}$ (the absolute value of $HOMO_{HOST1}$ is larger than the absolute value of $HOMO_{EM1}$); and $HOMO_{EM1}$ is equal or almost equal to $HOMO_{EM2}$. Note that the phrase "orbital levels are equal or almost equal" means that a difference between the orbital levels is less than or equal to 0.2 eV. (FIG. 1B is a schematic view illustrating the correlation of orbital levels of layers included in the EL layer 103. A rectangle in FIG. 1B represents each layer. The lower side of the rectangle represents the HOMO level of a main material or a host material of each layer, and the upper side of the rectangle represents the LUMO level of the main material or the host material of each layer. The dashed lines in the rectangle schematically represent the HOMO level and the LUMO level of a guest material included in each layer.) Note that the phrase "the orbital level of B is deeper than the orbital level of A" means that the energy of the orbital level of B is lower than the energy of the orbital level of A, and the phrase "the orbital level of B is shallower than the orbital level of A" means that the energy of the orbital level of B is higher than the energy of the orbital level of A.

Figure 3:
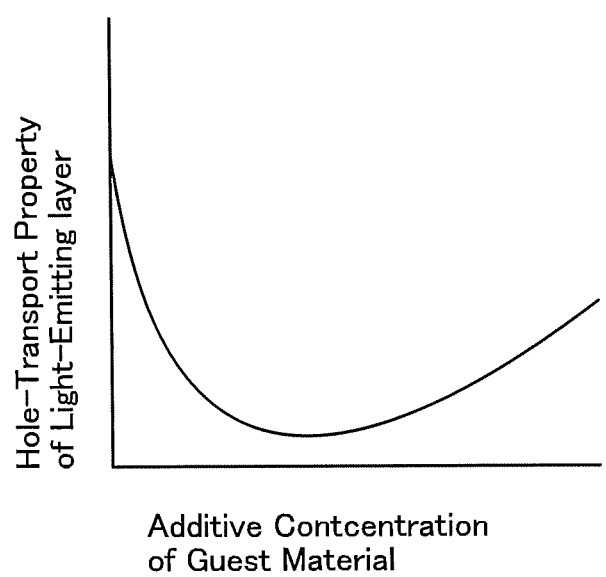
FIG. 3 is a conceptual diagram illustrating the relationship between the additive concentration of a guest material and a hole-transport property according to Embodiment.

In particular, in the case where $HOMO_{HOST1}$ is not extremely deeper than $HOMO_{EM1}$ (in the case where the absolute value of $HOMO_{HOST1}$ is not extremely larger than the absolute value of $HOMO_{EM1}$), specifically in the case where $HOMO_{HOST1}$ is deeper than $HOMO_{EM1}$ (in the case where the absolute value of $HOMO_{HOST1}$ is larger than the absolute value of $HOMO_{EM1}$) by about 0.3 (eV), the hole-transport property of the first light-emitting layer 113a and the hole-transport property of the second light-emitting layer 113b can be controlled by the amount of guest materials added to the first light-emitting layer 113a and the second light-emitting layer 113b. FIG. 3 is a conceptual diagram showing the relationship between the additive concentration of a guest material and a hole-transport property of a light-emitting layer in which the guest material is added to a host material whose HOMO level is deeper than the HOMO level of the guest material (a host material whose absolute value of the HOMO level is larger than the absolute value of the HOMO level of the guest material).

The HOMO level of the guest material is shallower than (the absolute value of the HOMO level thereof is smaller than that of) the HOMO level of the host material. Therefore, holes are trapped by the HOMO level of the guest material. Consequently, the hole-transport property of the light-emitting layer to which the guest material is added is suppressed. However, when the amount of the guest material added is further increased, the HOMO level of the guest material starts forming a pass. Therefore, the hole-transport property is inverted and increased since the hole-transport property is suppressed to the minimum. Note that the amount of the guest material added, at which the hole-transport property of the light-emitting layer is suppressed to the minimum, is within the range of approximately 5 wt % to 10 wt %, though the amount differs in accordance with a material.

The concentration of the guest material included in the second light-emitting layer 113b of Embodiment 1 is such that the hole-transport property is suppressed to the minimum. Such a concentration of the guest material included in the second light-emitting layer 113b of Embodiment 1 is referred to as $C_2$. Further, the concentration $C_1$ of the light-emitting substance included in the first light-emitting layer 113a of Embodiment 1 is lower than the concentration $C_2$ of the light-emitting substance included in the second light-emitting layer 113b. When $C_1$ is made lower than $C_2$, the amount of the light-emitting substance used can be made small, and the hole-transport property of the first light-emitting layer 113a can be made higher than the hole-transport property of the second light-emitting layer 113b.

The light-emitting element of Embodiment 1 includes the light-emitting layer 113 with such a structure. Therefore, holes are concentrated in the second light-emitting layer 113b, so that a recombination region is formed in a region apart from the hole-transport layer 112. Further, the hole-transport property of the second light-emitting layer is suppressed to approximately the minimum due to the guest material. Thus, the phenomenon in which the holes pass through the light-emitting layer 113 and reach the electron-transport layer 114 is suppressed, whereby deterioration due to the reception of the holes by the electron-transport layer 114 is prevented.

Next, the behavior and recombination of electrons which move in the EL layer are described.

With the electron-injection layer 115, electrons are transported from the second electrode 104 serving as a cathode to the electron-transport layer 114. The electron-transport layer 114 has a high electron-transport property, so that the electrons are transported to the second light-emitting layer 113b.

Since the hole-transport property of the second light-emitting layer 113b is suppressed, the electrons transported from the electron-transport layer 114 are recombined with holes with high efficiency in the second light-emitting layer 113b. With energy generated by the recombination of the electrons and the holes, a light-emitting substance which is a guest material is excited, so that light is emitted.

Further, even in the case where electrons leak from the second light-emitting layer 113b to the first light-emitting layer 113a, the electrons which have leaked can be recombined with holes in the first light-emitting layer 113a. Since a light-emitting substance is added to the first light-emitting layer 113a as a guest material, light is emitted. Thus, emission efficiency is not diminished. In this manner, a large area of the light-emitting layer 113 is used as a recombination region, whereby the probability of recombination of holes and electrons can be increased. Thus, emission efficiency can be increased.

Note that if electrons reach the hole-transport layer 112 without being recombined with holes in the second light-emitting layer 113b and the first light-emitting layer 113a, emission efficiency may be diminished, and the hole-transport layer 112 might deteriorate.

However, the hole-transport layer 112 which is illustrated in Embodiment 1 includes the first organic compound and the anti-reducing substance. Note that in the case where the LUMO level of the first organic compound ($LUMO_{HTL}$) is shallower than the LUMO level of the host material included in the first light-emitting layer 113a ($LUMO_{HOST1}$), electrons are not easily injected from the first light-emitting layer 113a. Thus, the electrons can be trapped in the first light-emitting layer 113a.

The electrons which have reached the hole-transport layer 112 are received by the anti-reducing substance instead of the first organic compound, so that a phenomenon in which the first organic compound deteriorates due to a reduction is prevented and the hole-transport layer 112 is prevented from deteriorate. Note that the anti-reducing substance does not emit light in the hole-transport layer 112.

Materials included in layers of the light-emitting element of Embodiment 1 are described in detail.

The substrate 101 is used as a support of the light-emitting element. For the substrate 101, glass, quartz, plastics, or the like can be used, for example.

As specific examples of the glass substrate, any of the following substrates can be used: non-alkaline glass substrates formed using barium borosilicate glass, aluminoborosilicate glass, aluminosilicate glass, and the like by a fusion method or a float method; ceramic substrates; plastic substrates having heat resistance enough to withstand a process temperature of this manufacturing process; and the like. For example, a glass substrate which contains more barium oxide (BaO) than boric acid ($B_2O_3$) and has a strain point of 730° C. or higher is preferable. This is because the glass substrate does not strain even when the semiconductor layer is thermally processed at high temperatures of about 700° C.

In the case where the substrate 100 is a mother glass, the substrate may have any of the following sizes: the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like.

Alternatively, a metal substrate such as a stainless steel alloy substrate which is provided with an insulating film over the surface may be used. A plastic substrate has features such as being lightweight, being flexible, and making visible light transmitted, which are attractive as a substrate of a light-emitting element. A substrate in which a film with moisture resistivity is deposited onto or attached to a plastic substrate may be used so that the light-emitting element can be protected against an impurity such as water.

In addition, an insulating film as a base film may be formed over the substrate 101. The base film may be formed to have a single-layer structure or a stacked-layer structure of a silicon oxide film, a silicon nitride film, a silicon oxynitride film, and/or a silicon nitride oxide film by a CVD method, a sputtering method, or the like. Further, the substrate 101 in which a driver circuit of a light-emitting device, or the like is separately manufactured may be used, and an EL layer may be formed over a first electrode which is electrically connected to the driver circuit.

In the case where the first electrode 102 formed over the substrate 101 is used as an anode, a metal, an alloy, an electroconductive compound, a mixture thereof, or the like having a high work function (specifically, a work function of 4.0 eV or more) is preferably used. Specifically, for example, indium oxide-tin oxide (ITO: Indium Tin Oxide), indium oxide-tin oxide including silicon or silicon oxide, indium oxide-zinc oxide (IZO: Indium Zinc Oxide), indium oxide containing tungsten oxide and zinc oxide (IWZO), and the like are given. Besides, gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (for example, titanium nitride), and the like can be given.

These materials are generally deposited by a sputtering method. For example, indium oxide-zinc oxide (IZO) can be deposited by a sputtering method with the use of a target in which 1 wt % to 20 wt % of zinc oxide is mixed into indium oxide, or indium oxide containing tungsten oxide and zinc oxide (IWZO) can be formed by a sputtering method using a target in which 0.5 wt % to 5 wt % of tungsten oxide and 0.1 wt % to 1 wt % of zinc oxide are mixed into indium oxide. Alternatively, by application of a sol-gel method or the like, an ink-jet method, a spin coating method, or the like may be used.

Note that in the case where a layer including a composite material described later is used as the layer in contact with the first electrode 102, which is included in the EL layer 103 formed over the first electrode 102 serving as an anode, any of a variety of metals, alloys, electroconductive compounds, and a mixture thereof can be used as a substance used for the first electrode 102, regardless of whether the work function is high or low. For example, aluminum (Al), silver (Ag), an alloy containing aluminum (AlSi), or the like can also be used.

Alternatively, any of the following low-work function materials can be used: elements belonging to Group 1 or Group 2 of the periodic table, that is, alkali metals such as lithium (Li) and cesium (Cs), alkaline-earth metals such as magnesium (Mg), calcium (Ca), and strontium (Sr), and alloys thereof (MgAg, AlLi); rare earth metals such as europium (Eu) and ytterbium (Yb), and alloys thereof; and the like.

Note that in the case where the first electrode 102 is formed using an alkali metal, an alkaline-earth metal, or an alloy thereof, a vacuum evaporation method or a sputtering method can be used. Alternatively, in the case where a silver paste or the like is used, a coating method, an ink-jet method, or the like can be used.

The EL layer 103 formed over the first electrode 102 can be formed using a known material, and either a low molecular compound or a high molecular compound can be used. Note that the substance included in the EL layer 103 is not limited to the first organic compound and may include an inorganic compound.

Here, materials included in layers of the EL layer 103 are described in detail.

The hole-transport layer 112 includes the first organic compound and an anti-reducing substance. In particular, a composite material in which an acceptor substance is added as an anti-reducing substance to the first organic compound exhibits a hole-transport property and stability with respect to an electron transported from the light-emitting layer. Further, the composite material also has a high hole-injection property; thus, the hole-transport layer 112 formed using the composite material can also serve as a hole-injection layer.

As the acceptor substance used for the anti-reducing substance, organic compounds such as 7,7,8,8-tetracyano-2,3,5,6-tetrafluoroquinodimethane (abbreviation: $F_4$-TCNQ) and chloranil, and a transition metal oxide can be given. In addition, oxides of metals belonging to any one of Groups 4 to 8 of the periodic table can also be given. Specifically, vanadium oxide, niobium oxide, tantalum oxide, chromium oxide, molybdenum oxide, tungsten oxide, manganese oxide, and rhenium oxide are preferable because their electron-accepting properties are high. Among these, molybdenum oxide is especially preferable since it is stable in the air, its hygroscopic property is low, and it is easily treated.

As the first organic compound for forming the composite material together with the acceptor substance, various compounds such as an aromatic amine compound, a carbazole derivative, aromatic hydrocarbon, and a high-molecular compound (such as oligomer, dendrimer, or polymer) can be used. Note that the first organic compound used for the composite material is preferably an organic compound having a high hole-transport property. Specifically, a substance having a hole mobility of $10^{-6}$ cm$^2$/Vs or higher is preferably used. However, substances other than the above described materials may also be used as long as the substances have higher hole-transport properties than electron-transport properties. Examples of the first organic compound which can be used for the composite material are specifically shown below.

As the first organic compound which can be used for the composite material, the following can be given, for example: aromatic amine compounds such as 4,4',4"-tris[N-(3-methylphenyl)-N-phenylamino]triphenylamine (abbreviation: MTDATA), 4,4',4"-tris(N,N-diphenylamino)triphenylamine (abbreviation: TDATA), 4,4'-bis[N-(4-diphenylaminophenyl)-N-phenylamino]biphenyl (abbreviation: DPAB), 4,4'-bis(N-{4-[N'-(3-methylphenyl)-N-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), N-(4-biphenyl)-4-(carbazol-9-yl)phenylaniline (abbreviation: YGA1BP), 4-phenyl-4'-(1-naphthyl)triphenylamine (abbreviation: αNBA1BP), and 4,4',4"-tri(N-carbazolyl)triphenylamine (abbreviation: TCTA); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene.

Further, the following can be given: aromatic hydrocarbon compounds such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Further, the following can be given: aromatic hydrocarbon compounds such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Further, high molecular compounds such as PVK, PVTPA, PTPDMA, and Poly-TPD can be used.

In the case where a composite material in which an acceptor substance is included as an anti-reducing substance in the first organic compound is used for the hole-transport layer 112, it is not necessary to provide a hole-injection layer because the hole-transport layer 112 has a high hole-injection property. Further, a material for the first electrode 102 serving as an anode is not limited to a material having a high work function, and the first electrode 102 serving as an anode can be formed using a material having a low work function.

Such a composite material can be formed by co-evaporation of the first organic compound and the anti-reducing substance.

As an example of an anti-reducing substance other than the acceptor substance, an organic compound whose LUMO level is deeper than that of the host material of the first light-emitting layer 113a, whose band gap is wider than that of the light-emitting substance of the first light-emitting layer 113a, and whose HOMO level is deeper than that of the first organic compound of the hole-transport layer 112 can be given. The addition of such a material to the hole-transport layer 112 can prevent reduction of the first organic compound which is caused by the reception of electrons which have leaked from the first light-emitting layer through the LUMO level. Note that in the case where an anti-reducing substance other than the acceptor substance is used, it is preferable that the first organic compound be used in combination with a substance with a high hole-transport property.

As the substance with a high hole-transport property, for example, the following can be given: aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB). The substances mentioned here are mainly ones that have a hole mobility of $10^{-6}$ cm$^2$/Vs or higher. However, substances other than the above described substances may also be used as long as the substances have higher hole-transport properties than electron-transport properties. A layer containing the substance with a high hole-transport property is not limited to a single layer, and two or more layers containing the aforementioned substance may be stacked.

Holes and electrons are injected to the light-emitting layer 113, and the hole-transport property of the first light-emitting layer 113a is higher than the hole-transport property of the second light-emitting layer 113b. Such a light-emitting layer 113 may be formed using a guest material and a material capable of an oxidation and a reduction, that is, a bipolar host material, in combination.

As such an organic compound which is capable of an oxidation and a reduction and is used as the host material included in the light-emitting layer 113, a tricyclic condensed aromatic compound, a tetracyclic condensed aromatic compound, a pentacyclic condensed aromatic compound, and a hexacyclic condensed aromatic compounds are given, for example. In particular, an anthracene derivative, a phenanthrene derivative, a pyrene derivative, a chrysene derivative, a dibenzo[g,p]chrysene derivative, a triphenylene derivative, a naphthacene derivative, and the like are given.

For example, the following can be given: 9,10-diphenylanthracene (abbreviation: DPAnth), N,N-diphenyl-9-[4-(10-phenyl-9-anthryl)phenyl]-9H-carbazol-3-amine (abbreviation: CzA1PA), 9-phenyl-9'-[4-(10-phenyl-9-anthryl)phenyl]-3,3'-bi(9H-carbazole) (abbreviation: PCCPA), 6,12-dimethoxy-5,11-diphenylchrysene, 9-[4-(10-phenyl-9-anthryl)phenyl]-9H-carbazole (abbreviation: CzPA), 3,6-diphenyl-9-[4-(10-phenyl-9-antryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (t-BuDNA), 9,9'-bianthryl (abbreviation: BANT), 9-[4-(9-phenylcarbazol-3-yl)]phenyl-10-phenylanthracene (abbreviation: PCzPA), 9-[4-(3-phenyl-9H-carbazol-9-yl)phenyl]-10-phenylanthracene (abbreviation: CzPAP), 9,10-bis[4-(9-phenylcarbazol-3-yl)]phenyl-2-t-butylanthracene (abbreviation: PCzBPA), 3-(9,9-dimethylfluoren-2-yl)-9-[4-(10-phenyl-9-anthryl)phenyl]-9H-carbazole (abbreviation: CzPAFL), 9-{4-[3-(1-naphthyl)-9H-carbazol-9-yl]phenyl}-10-phenylanthracene (abbreviation: CzPAαN), 9-{4-[10-(1-naphthyl)-9-anthryl]phenyl}-9H-carbazole (abbreviation: αNCzPA), 9-[3-(10-phenyl-9-anthryl)phenyl]-9H-carbazole (abbreviation: mCzPA), 9,9'-(stilbene-3,3'-diyl)diphenanthrene (abbreviation: DPNS), 9,9'-(stilbene-4,4'-diyl)diphenanthrene (abbreviation: DPNS2); 3,3',3''-(benzene-1,3,5-triyl)tripyrene (abbreviation: TPB3), and the like.

As the host material used for dispersing the guest material, plural kinds of substances mixed to be used. For example, in order to control a carrier-transport property, a material with a high hole-transport property can be mixed into a material with a high electron-transport property, so that the thus obtained material can be used for the host material. Further, for example, in order to suppress crystallization, a substance for suppressing crystallization, such as rubrene, may be added, so that the thus obtained material may be used for the host material.

Further, a high molecular compound can be used for the host material included in the light-emitting layer 113.

The light-emitting layer 113 includes a light-emitting substance as a guest material. As the light-emitting substance, for example, the following organic compounds can be given.

As a substance which emits blue light, a substance having an emission peak wavelength greater than or equal to 400 nm and less than 480 nm may be used, for example, and the following can be given: N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazole-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), and the like. In addition, a phosphorescent material such as bis[2-(4',6'-difluorophenyl)pyridinato-N,C$^{2'}$]iridium(III)tetrakis(1-pyrazolyl)borate (abbreviation: FIr6) or bis[2-(4',6'-difluorophenyl)pyridinato-N,C$^{2'}$]iridium(III)picolinate (abbreviation: FIrpic) can also be given.

As a substance which emits blue green light, a substance having an emission peak wavelength greater than or equal to 480 nm and less than 520 nm may be used, for example, and the following can be given: N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, and the like. In addition, a phosphorescent material such as bis[2-(3',5'-bistrifluoromethylphenyl)pyridinato-N,C$^{2'}$]iridium(III)picolinate (abbreviation: Ir(CF$_3$ppy)$_2$(pic)) or bis[2-(4',6'-difluorophenyl)pyridinato-N,C$^{2'}$]iridium(III)acetylacetonate (abbreviation: FIracac) can also be given.

As a substance which emits green light, the following can be given: N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracene-2-amine (abbreviation: 2YGABPhA), N,N,9-triphenylanthracen-9-amine (abbreviation: DPhAPhA), coumarin 545T, N,N'-diphenylquinacridone (abbreviation: DPQd), and the like. In addition, the following can be given: tris(2-phenylpyridinato)iridium(III) (abbreviation: Ir(ppy)$_3$), bis(2-phenylpyridinato)iridium(III)acetylacetonate (abbreviation: Ir(ppy)$_2$(acac)), tris(acetylacetonato)(monophenanthroline)terbium(III) (abbreviation: Tb(acac)$_3$(Phen)), and the like.

As a substance which emits yellow light, for example, a substance having an emission peak wavelength greater than or equal to 540 nm and less than 600 nm may be used, for example, and the following can be given: rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), and the like. In addition, a phosphorescent material such as bis(benzo[h]quinolinato)iridium(III)acetylacetonate (abbreviation: Ir(bzq)$_2$(acac)), bis(2,4-diphenyl-1,3-oxazolato-N,C$^{2'}$)iridium(III)acetylacetonate (abbreviation: Ir(dpo)$_2$(acac)), bis[2-(4'-(perfluorophenylphenyl)pyridinato]iridium(III) acetylacetonate (abbreviation: Ir(p-PF-ph)$_2$(acac)), or bis(2-phenylbenzothiazolato-N,C$^{2'}$)iridium(III)acetylacetonate (abbreviation: Ir(bt)$_2$(acac)) can also be used.

As a substance which emits red light, a substance having an emission peak wavelength greater than or equal to 600 nm and less than 700 nm may be used, for example, and the following can be given: N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). In addition, a phosphorescent material such as bis[2-(2'-benzo[4,5-α]thienyl)pyridinato-N,C$^{3'}$)iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (2,3,7,8,12,13,17,18-octaethyl-21H,23H-porphyrinato)platinum(II) (abbreviation: PtOEP), tris(1,3-diphenyl-1,3-propanedionato)(monophenanthroline)europium(III) (abbreviation: Eu(DBM)$_3$(Phen)), or tris[1-(2-thenoyl)-3,3,3-trifluoroacetonato](monophenanthroline)europium(III) can also be given.

Note that the concentration of the light-emitting substance in the second light-emitting layer 113b is preferably lower than or equal to 10% in terms of mass ratio. Further, in the case where the first light-emitting layer 113a and the second light-emitting layer 113b are formed using the same host materials, the concentration of the light-emitting substance in the first light-emitting layer 113a is made lower than the concentration of the light-emitting substance in the second light-emitting layer 113b.

The electron-transport layer 114 includes a substance with high electron-transport property.

For example, the electron-transport layer 114 is a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq), or the like. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here are mainly ones that have an electron mobility of $10^{-6}$ cm$^2$/Vs or higher. The electron-transport layer may be formed using substances other than those described above as long as the materials have electron-transport properties higher than hole-transport properties. Furthermore, the electron-transport layer is not limited to a single layer, and two or more layers including the aforementioned substances may be stacked.

Alternatively, high molecular compounds can be used. For example, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy), or the like can be used.

The electron-injection layer 115 includes a substance with a high electron-injection property.

For example, an alkali metal, an alkaline-earth metal, or a compound thereof, such as lithium fluoride (LiF), cesium fluoride (CsF), or calcium fluoride (CaF$_2$), can be used. Alternatively, a layer of a substance with an electron-transport property which includes an alkali metal, an alkaline-earth metal, or a compound thereof, specifically, a layer of Alq which includes magnesium (Mg), or the like may be used. Note that in this case, electrons can be more efficiently injected from the second electrode 104.

For the second electrode 104, a metal, an alloy, an electroconductive compound, a mixture thereof, or the like which has a low work function (specifically, a work function of 3.8 eV or less) can be used. As specific examples of such a cathode material, elements that belong to Group 1 or 2 of the periodic table, that is, alkali metals such as lithium (Li) and cesium (Cs), alkaline-earth metals such as magnesium (Mg), calcium (Ca), and strontium (Sr), alloys containing these (MgAg, AlLi, or the like), rare earth metals such as europium (Eu) and ytterbium (Yb), alloys containing these, and the like can be given.

Note that in the case where the second electrode 104 is formed using an alkali metal, an alkaline-earth metal, or an alloy thereof, a vacuum evaporation method or a sputtering method can be used. Alternatively, in the case of using a silver paste or the like, a coating method, an ink-jet method, or the like can be used.

Note that with the electron-injection layer 115 provided, the second electrode 104 can be formed using any of a variety of conductive materials such as Al, Ag, ITO, and indium oxide-tin oxide containing silicon or silicon oxide regardless of their work functions. A film including such a conductive material can be deposited by a sputtering method, an ink-jet method, a spin coating method, or the like.

In the light-emitting element of Embodiment 1, a difference between a potential applied to the first electrode 102 and a potential applied to the second electrode 104 makes current flow, and holes and electrons are recombined with each other in the EL layer 103, so that light is emitted. Therefore, in order to emit light outside of the light-emitting element, one of or both the first electrode 102 and the second electrode 104 may be formed using a conductive film having a light-transmitting property.

Note that when only the first electrode 102 is an electrode with a light-transmitting property, light emitted from the EL layer 103 is extracted from the substrate 101 side through the first electrode 102. Alternatively, when only the second electrode 104 is an electrode having a light-transmitting property, light emitted from the EL layer 103 is extracted from a side opposite to the substrate 101 side through the second electrode 104. Alternatively, when the first electrode 102 and the second electrode 104 are electrodes with a light-transmitting property, light emitted from the EL layer 103 is extracted from both the substrate 101 side and the side opposite to the substrate 101 side through the first electrode 102 and the second electrode 104.

As a method for forming the EL layer 103 which is described above, various methods can be used regardless of a dry process or a wet process. For example, a vacuum evaporation method, an ink-jet method, a spin coating method, or the like can be used. Note that the layers included in the EL layer 103 may be formed using different formation methods.

The second electrode 104 can be formed by a wet process such as a sol-gel method using a paste of a metal material as well as a dry process such as a sputtering method or a vacuum evaporation method.

Note that the structure of the EL layer provided between the first electrode 102 and the second electrode 104 is not limited to the above structure. The structure of the EL layer may be any structure as long as the following conditions are satisfied: at least the hole-transport layer 112, the first light-emitting layer 113a, the second light-emitting layer 113b, and the electron-transport layer 114 are included; carrier-transport properties of the first light-emitting layer 113a and the second light-emitting layer 113b are bipolar; a hole-transport property of the first light-emitting layer 113a is higher than a hole-transport property of the second light-emitting layer 113b; the first light-emitting layer 113a and the second light-emitting layer 113b each include a light-emitting substance; and the hole-transport layer 112 includes the first organic compound and the anti-reducing substance.

Figure 4:
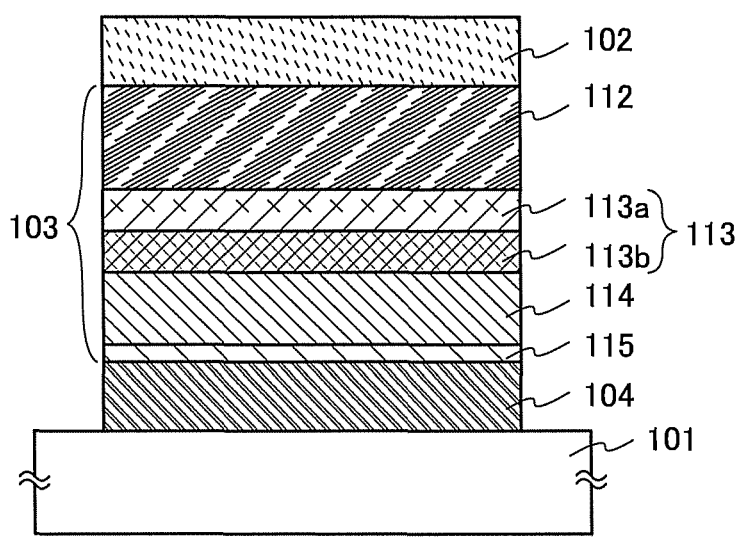
FIG. 4 illustrates a light-emitting element according to Embodiment.

Alternatively, as shown in FIG. 4, a structure may be employed in which the second electrode 104 serving as a cathode, the EL layer 103, and the first electrode 102 serving as an anode are stacked in that order over the substrate 101. In this case, the El layer 103 has a structure in which the electron-injection layer 115, the electron-transport layer 114, the second light-emitting layer 113b, the first light-emitting layer 113a, and the hole-transport layer 112 are stacked in that order over the second electrode 104, for example.

Figure 5A:
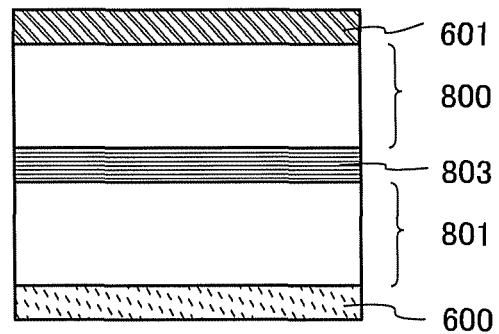
FIGS. 5A and 5B illustrate a light-emitting element according to Embodiment.
Figure 5B:
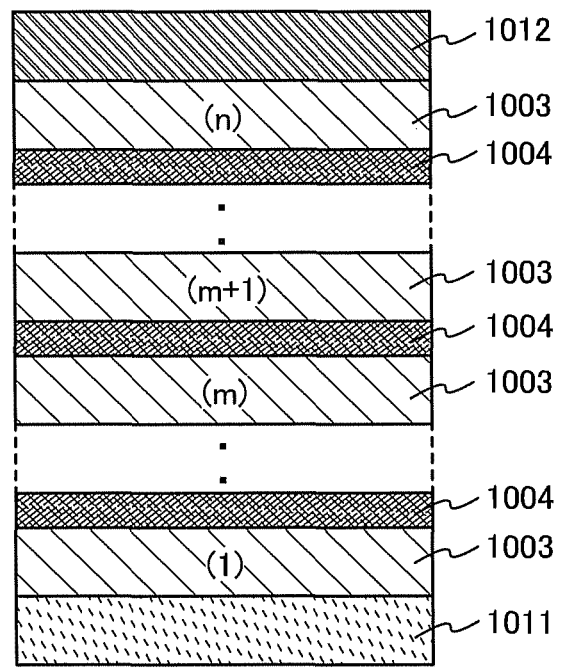

The structure of the light-emitting element described in Embodiment 1 may be a structure in which a plurality of EL layers 1003 are stacked between a pair of electrodes as illustrated in FIG. 5B, that is, a stacked-layer element structure. Note that each of intermediate layers 1004 is interposed between two of the plurality of EL layers. For example, in the case where the light-emitting element described in Embodiment 1 includes n (n is a natural number of 2 or more) EL layers 1003 between the pair of electrodes, an intermediate layer 1004 is provided between an m-th (m is a natural number, where 1≤m≤n−1) EL layer 1003 and an (m+1)-th EL layer 1003.

Note that the intermediate layer 1004 has a function of injecting holes to one EL layer 1003 in contact with the intermediate layer 1004 and injecting electrons to the other EL layer 1003 when voltage is applied to a first electrode 1011 and a second electrode 1012. For example, in a stacked-layer element structure in which the first electrode 1011 is an anode and the second electrode 1012 is a cathode, the intermediate layer 1004 injects holes to the EL layer 1003 in contact with a side on the cathode side of the intermediate layer 1004 and injects electrons to the EL layer 1003 in contact with a side on the anode side of the intermediate layer 1004.

Note that in the case where the first electrode 1011 is an anode, the hole-transport layer of the EL layer 1003 may be formed over the first electrode 1011 and in contact with a side on the second electrode 1012 side of the intermediate layer 1004. Note also that in the case where the first electrode 1011 is a cathode, the electron-injection layer of the EL layer 1003 may be formed over the first electrode 1011 and in contact with a side on the second electrode 1012 side of the intermediate layer 1004.

The intermediate layer 1004 can be formed using the above-described composite material of an organic compound and an inorganic compound (the composite material with a hole-injection property or the composite material with an electron-injection property) or formed using materials such as metal oxides in appropriate combination. Still preferably, the intermediate layer 1004 is formed using a composite material with a hole-injection property and a different material in combination. These materials used for the intermediate layer 1004 have high carrier-injection properties and high carrier-transport properties, and thus, a light-emitting element can achieve low-current driving.

The structure of the stacked-layer element is preferable in the case where white light emission is obtained. With the stacked-layer element structure combined with the structure of Embodiment 1, a long-lifetime light-emitting device with high efficiency can be manufactured.

As for the combination of a plurality of light-emitting layers, a structure for obtaining white light by including red light, green light, and blue light may be used. For example, the structure may include a first EL layer 801 containing a blue fluorescent material as a light-emitting substance and a second EL layer 800 containing red and green phosphorescent materials as light-emitting substances. FIG. 5A illustrates a structure of the case where two EL layers are stacked. In the FIG. 5A, the first EL layer 801 and the second EL layer 800 are stacked between a first electrode 600 and a second electrode 601. In such a case, it is preferable that a charge generation layer 803 be provided between the first EL layer 801 and the second EL layer 800.

Also with a structure including light-emitting layers emitting light of complementary colors, white light emission can be obtained. When light emitted from the first EL layer and light emitted from the second EL layer have complementary colors to each other in a stacked-layer element including two EL layers stacked, the combination of colors are as follows: blue and yellow, blue-green and red, and the like. A substance which emits light of blue, yellow, blue-green, or red may be selected as appropriate from, for example, the light-emitting substances given above.

The following will describe an example of a structure in which a first EL layer and a second EL layer each having a plurality of light-emitting layers emitting light of complementary colors is included such that white light can be obtained.

For example, the first EL layer includes a first light-emitting layer which exhibits an emission spectrum whose peak is in the wavelength range of blue to blue-green, and a second light-emitting layer which exhibits an emission spectrum whose peak is in the wavelength range of yellow to orange. The second EL layer includes a third light-emitting layer which exhibits an emission spectrum whose peak is in the wavelength range of blue-green to green, and a fourth light-emitting layer which exhibits an emission spectrum whose peak is in the wavelength range of orange to red.

In this case, light emitted from the first EL layer is a combination of light emitted from the first light-emitting layer and light emitted from the second light-emitting layer and thus exhibits an emission spectrum having peaks both in the wavelength range of blue to blue-green and in the wavelength range of yellow to orange. That is, the first EL layer exhibits light emission which has a 2-wavelength-type white color or a 2-wavelength-type color that is similar to white.

In addition, light emitted from the second EL layer is a combination of light emitted from the third light-emitting layer and light emitted from the fourth light-emitting layer and thus exhibits an emission spectrum having peaks both in the wavelength range of blue-green to green and in the wavelength range of orange to red. That is, the second EL layer exhibits light emission which has a 2-wavelength-type white color or a 2-wavelength-type color that is similar to white, which is different from that of the first EL layer.

Accordingly, by combination of the light emitted from the first EL layer and the light emitted from the second EL layer, white light emission which covers the wavelength range of blue to blue-green, the wavelength range of blue-green to green, the wavelength range of yellow to orange, and the wavelength range of orange to red can be obtained.

Note that in the aforementioned stacked-layer element structure, the intermediate layer is provided between the stacked EL layers, whereby the element can emit light in a high-luminance region while current density is kept low. Since the current density can be kept low, a long-lifetime element can be realized. In addition, the voltage drop due to the resistance of the electrode material can be diminished, whereby uniform light emission in a large area is possible.

Note that Embodiment 1 can be combined with any of Embodiments 2, 3, and 4 as appropriate.

With the use of the light-emitting element illustrated in Embodiment 1, a lighting device and a passive-matrix light-emitting device can be manufactured. Further, a light-emitting element is controlled by a thin film transistor (TFT), whereby an active-matrix light-emitting device can be manufactured.

Note that there is no particular limitation on the structure of the TFT which is obtained in the case of manufacturing an active matrix light-emitting device. For example, a staggered TFT or an inverted staggered TFT can be used as appropriate. Further, a driver circuit formed over a TFT substrate may be formed using both an n-channel TFT and a p-channel TFT or only either an n-channel TFT or a p-channel TFT. Further, as the semiconductor film used for the TFT, a semiconductor film formed using an element belonging to Group 14 of the periodic table, which is typified by Si, may be used, or a compound semiconductor film, an oxide semiconductor film, or particularly, a composite oxide semiconductor film including indium, gallium, zinc, and the like may be used. Furthermore, there is no particular limitation on the crystallinity of a semiconductor film used for the TFT. An amorphous semiconductor film may be used, or a crystalline semiconductor film may be used.

The light-emitting element illustrated in Embodiment 1 has the light-emitting layer whose carrier-transport property is bipolar and in which on the side near the anode has a hole-transport property higher than the side near the cathode. A recombination region of carriers is formed in the light-emitting layer. Thus, the light-emitting element illustrated in Embodiment 1 has high emission efficiency.

Further, in the light-emitting element illustrated in Embodiment 1, the hole-transport layer includes an anti-reducing substance. Therefore, even when electrons which have passed through the light-emitting layer from the electron-transport layer side reach the hole-transport layer, deterioration of the hole-transport layer is suppressed. Thus, the light-emitting element illustrated in Embodiment 1 has high reliability.

Embodiment 2

A light-emitting layer included in a light-emitting element which is illustrated in Embodiment 2 includes a first light-emitting layer in contact with a hole-transport layer, a second light-emitting layer in contact with the first light-emitting layer, and a third light-emitting layer in contact with the second light-emitting layer. The first light-emitting layer and the second light-emitting layer each include a bipolar host material and a guest material which is a light-emitting substance, and the hole-transport property of the first light-emitting layer is higher than that of the second light-emitting layer. The third light-emitting layer prevents holes from being injected from the light-emitting layer to an electron-transport layer. Further, an anti-reducing substance is included in the hole-transport layer so that the hole-transport layer is not reduced by electrons passing through the light-emitting layer and reaching the hole-transport layer.

Figure 2A:
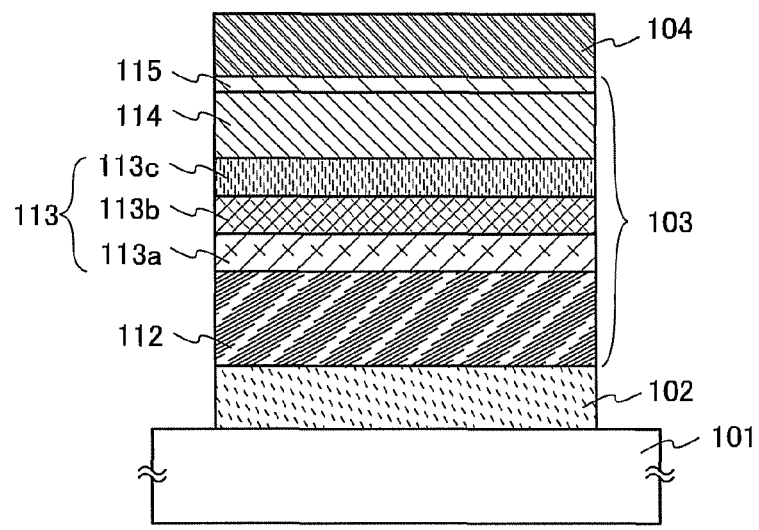
FIGS. 2A and 2B illustrate a light-emitting element according to Embodiment.

FIG. 2A illustrates the structure of the light-emitting element of Embodiment 2. The light-emitting element of Embodiment 2 includes a first electrode 102, a second electrode 104, and an EL layer 103. The first electrode 102 is formed over a glass substrate 101 and serves as an anode in Embodiment 2. The EL layer 103 includes at least a hole-transport layer 112, a light-emitting layer 113 (a first light-emitting layer 113a, a second light-emitting layer 113b, and a third light-emitting layer 113c), and an electron-transport layer 114, and further, an electron-injection layer 115 and the like are combined as appropriate. The hole-transport layer 112 is provided between the first electrode 102 and the first light-emitting layer 113a, and is in contact with a side on the anode side of the first light-emitting layer 113a. The second light-emitting layer 113b is provided between the first light-emitting layer 113a and the second electrode 104 serving as a cathode, and is in contact with a side on the cathode side of the first light-emitting layer 113a. The third light-emitting layer 113c is provided between the second light-emitting layer 113b and the second electrode 104 serving as a cathode, and is in contact with a side on the cathode side of the second light-emitting layer 113b. The electron-transport layer 114 is provided between the third light-emitting layer 113c and the second electrode 104 serving as a cathode, and is in contact with a side on the cathode side of the third light-emitting layer 113c. The second electrode 104 serves as a cathode. The electron-injection layer 115 is provided between the electron-transport layer 114 and the second electrode 104.

That is, in the light-emitting element of Embodiment 2, the third light-emitting layer 113c is formed between the second light-emitting layer 113b and the electron-transport layer 114 of the light-emitting element which is illustrated in Embodiment 1. Therefore, only a portion relating to the third light-emitting layer 113c is described in Embodiment 2.

Figure 2B:
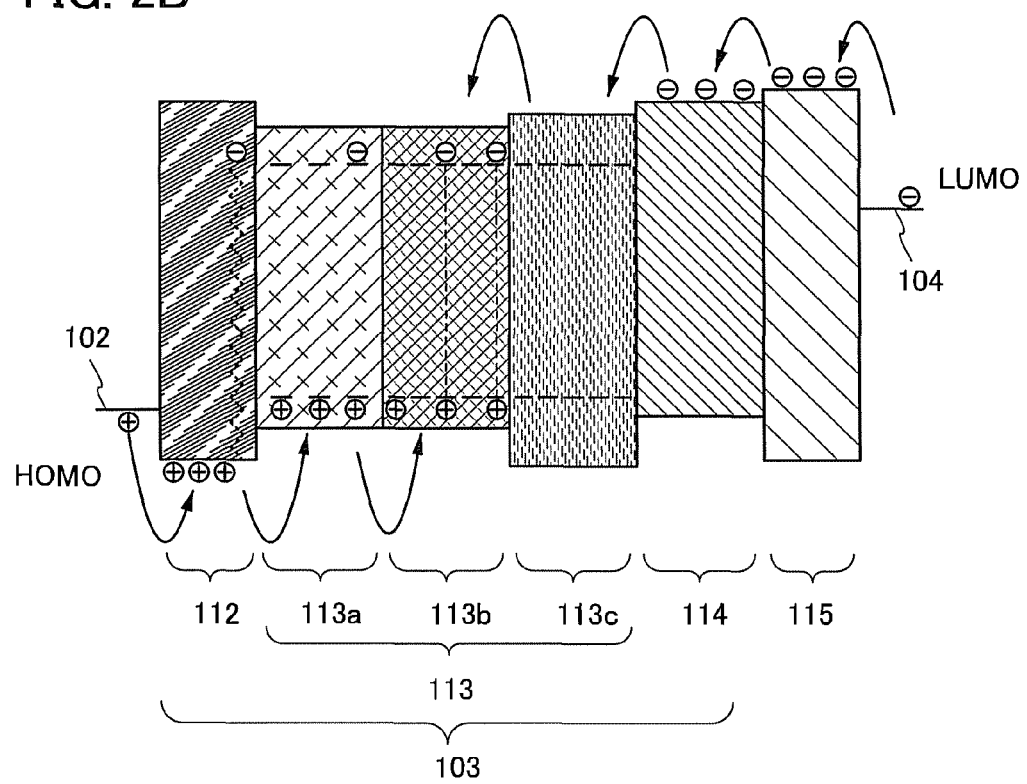

Next, the behavior of carriers in the light-emitting element of Embodiment 2 is described. FIG. 2B illustrates a band structure of layers, i.e., the correlation of bands included in layers, concerning the EL layer of the light-emitting element illustrated in Embodiment 2. Note that a structure of a portion including the hole-transport layer 112, the first light-emitting layer 113a, and the second light-emitting layer 113b, and the behavior of carriers are the same or substantially the same as that described in Embodiment 1, so the description of these layers is omitted here.

The third light-emitting layer 113c includes a host material and a guest material. The third light-emitting layer 113c is interposed between the electron-transport layer 114 and the second light-emitting layer 113b, whereby a recombination region of holes and electrons can be kept away from the electron-transport layer 114. Further, it is preferable that the third light-emitting layer 113c have an electron-transport property.

As the host material included in the third light-emitting layer 113c, a bipolar organic compound with a high electron-transport property is preferably used. In particular, the substance having an electron mobility of greater than or equal to $10^{-6}$ cm$^2$/Vs is used. With such a structure, holes can be prevented from being injected from the light-emitting layer 113 to the electron-transport layer 114.

Alternatively, the HOMO level of the host material included in the third light-emitting layer 113c (HOMO$_{HOST3}$) is preferably deeper than (the absolute value of the HOMO level thereof is larger than that of) the HOMO level of the host material included in the second light-emitting layer 113b (HOMO$_{HOST2}$). With such a structure, a barrier is formed between the second light-emitting layer 113b and the third light-emitting layer 113c, so that holes can be prevented from being transported to the electron-transport layer 114 through the third light-emitting layer 113c. Thus, holes and electrons can be recombined in the second light-emitting layer 113b, so that high emission efficiency can be obtained.

The third light-emitting layer 113c includes a light-emitting substance as the guest material. As a light-emitting substance included in the third light-emitting layer 113c, a substance whose highest occupied molecular orbital level (HOMO level) is shallower (whose absolute value is smaller) than that of the host material is preferably used. Further, the light-emitting substance included in the third light-emitting layer 113c may be the same as the light-emitting substance included in the first light-emitting layer or the second light-emitting layer.

Further, the HOMO level of the light-emitting substance included in the third light-emitting layer 113c as the guest material (HOMO$_{EM3}$), the HOMO level of the light-emitting substance included in the first light-emitting layer (HOMO$_{EM1}$), and the HOMO level of the light-emitting substance included in the second light-emitting layer (HOMO$_{EM2}$) are almost equal (see FIG. 2B). In Embodiment 2, the third light-emitting layer 113c includes the same light-emitting substance as each of the first light-emitting layer 113a and the second light-emitting layer 113b, but may include a light-emitting substance different from the first light-emitting layer 113a and the second light-emitting layer 113b.

As described above, by addition of the light-emitting substance to the third light-emitting layer 113c as the guest material, the transport of holes therein can be suppressed more than in the second light-emitting layer, and moreover, energy generated at the time of recombination of holes and electrons can be obtained as light emission.

The first electrode 102, the second electrode 104, and the layers in the EL layer 103 of the light-emitting element of Embodiment 2 can be formed using materials which are the same or substantially the same as those in Embodiment 1, as appropriate. Further, the direction of light emission, the stack order of the layers in the EL layer 103, and the like can be selected and used as appropriate in a manner similar to Embodiment 1. Therefore, detailed description thereof is omitted here.

The light-emitting layer included the light-emitting element illustrated in Embodiment 2 includes the first light-emitting layer in contact with the hole-transport layer, the second light-emitting layer in contact with the first light-emitting layer, and the third light-emitting layer in contact with the second light-emitting layer. The first light-emitting layer and the second light-emitting layer each include a bipolar host material and a guest material which is a light-emitting substance. Also, the hole-transport property of the first light-emitting layer is higher than that of the second light-emitting layer and the third light-emitting layer is provided between the second light-emitting layer and the electron-transport layer; therefore, injection of holes from the light-emitting layer to the electron-transport layer can be prevented. Thus, the light-emitting element illustrated in Embodiment 2 has higher emission efficiency.

Further, in the light-emitting element illustrated in Embodiment 2, the hole-transport layer includes an anti-reducing substance. Therefore, even when electrons which have passed through the light-emitting layer from the electron-transport layer side reach the hole-transport layer, deterioration of the hole-transport layer is suppressed. Thus, the light-emitting element illustrated in Embodiment 2 has high reliability.

Embodiment 3

Figure 12A:
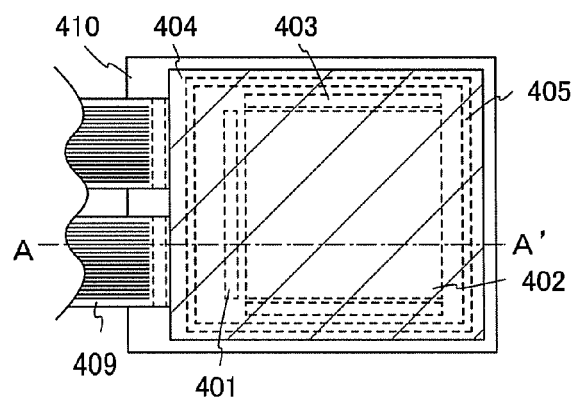
FIGS. 12A and 12B illustrate a light-emitting device according to Embodiment.
Figure 12B:
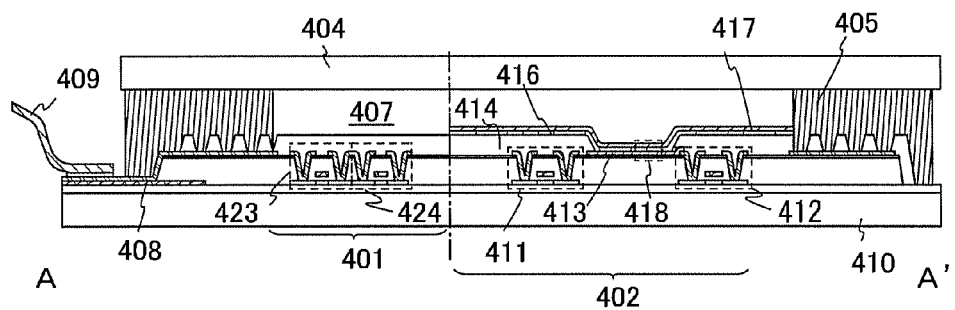

In Embodiment 3, a light-emitting device manufactured using a light-emitting element of an embodiment of the present invention is described with reference to FIGS. 12A and 12B and FIGS. 13A and 13B. Note that FIG. 12A is a top view illustrating the light-emitting device and FIG. 12B is a cross-sectional view of FIG. 12A taken along a line A-A'. Reference numeral 401 shown by a dotted line denotes a driver circuit portion (a source side driver circuit); reference numeral 402 denotes a pixel portion; and reference numeral 403 denotes a driver circuit portion (a gate side driver circuit). Reference numeral 404 denotes a sealing substrate; reference numeral 405 denotes a sealant; and an inner side region enclosed by the sealant 405 is a space 407.

Note that a lead wiring 408 is a wiring for transmitting signals that are to be inputted to the source side driver circuit 401 and the gate side driver circuit 403, and receives a video signal, a clock signal, a start signal, a reset signal, and the like from a flexible printed circuit (FPC) 409 which serves as an external input terminal. Although only the FPCs are illustrated here, printed wiring boards (PWBs) may be attached to the FPCs. The light-emitting device in this specification includes, in its category, not only the light-emitting device itself but also the light-emitting device provided with the FPC or the PWB.

Next, a cross-sectional structure of the light-emitting element is described with reference to FIG. 12B. The driver circuit portions and the pixel portion having a plurality of pixels are formed over a substrate 410. Here, the source side driver circuit 401 which is the driver circuit portion and one of the plurality of pixels in the pixel portion 402 are illustrated.

Note that in the source side driver circuit 401, a CMOS circuit which is obtained by combining an n-channel TFT 423 and a p-channel TFT 424 is formed. Further, the driver circuit may be formed using a variety of a CMOS circuit, a PMOS circuit, or an NMOS circuit which is formed using TFTs. In Embodiment 3, a driver-integrated type in which a driver circuit is formed on a substrate is shown; however, it is not necessary to have such a structure, and the driver circuit can be formed not on the substrate but outside the substrate.

The pixel portion 402 includes a plurality of pixels having a switching TFT 411, a current control TFT 412, and a first electrode 413 electrically connected to a drain of the current control TFT 412. An insulator 414 is formed to cover an end portion of the first electrode 413. Here, the insulator 414 is formed using a positive type photosensitive acrylic resin film.

The insulator 414 is formed to have a curved surface having curvature at an upper end portion or a lower end portion thereof in order to obtain favorable coverage. For example, when positive type photosensitive acrylic is used as a material for the insulator 414, the insulator 414 preferably has a curved surface with a curvature radius (0.2 μm to 3 μm) only as the upper end. Alternatively, as the insulator 414, either a negative type which becomes insoluble in an etchant by light or a positive type which becomes soluble in an etchant by light can be used.

Over the first electrode 413, a layer 416 including a light-emitting substance and a second electrode 417 are formed. Here, as a material for forming the first electrode 413 serving as the anode, it is preferable to use a material having a high work function. For example, the first electrode 413 can be formed using a stack of a titanium nitride film and a film containing aluminum as its main component; a three-layer structure of a titanium nitride film, a film containing aluminum as its main component, and another titanium nitride film; or the like, as well as a single-layer film such as an indium tin oxide (ITO) film, an indium tin oxide film containing silicon, an indium zinc oxide (IZO) film, a titanium nitride film, a chromium film, a tungsten film, a Zn film, or a Pt film. The stacked-layer structure achieves to have low wiring resistance, favorable ohmic contact, and a function as an anode.

Further, the layer 416 including a light-emitting substance which is interposed between the first electrode 413 and the second electrode 417 is formed in a manner similar to that in Embodiment 1 or Embodiment 2. Further, as a material used for the layer including a light-emitting substance, a single layer of an organic compound or stacked layers thereof is generally used; however, in the present invention, a structure may also be employed in which an inorganic compound is included in part of an organic compound film.

The layer 416 including a light-emitting substance can be formed by a variety of methods such as an evaporation method using an evaporation mask, an ink jet method, and a spin coating method.

As a material used for the second electrode 417 which is formed over the layer 416 including a light-emitting substance, it is preferable to use a material with a low work function (e.g., Al, Ag, Li, Ca, or an alloy or a compound thereof such as MgAg, MgIn, or AlLi). Note that in the case where light emitted from the layer 416 including a light-emitting substance is transmitted through the second electrode 417 which serves as a cathode, it is preferable to use, as the second electrode 417, a stack of a metal thin film with reduced film thickness and a transparent conductive film (an indium oxide-tin oxide alloy (ITO), an indium oxide-zinc oxide alloy ($In_2O_3$—ZnO), zinc oxide (ZnO), or the like).

Attachment of the sealing substrate 404 to the substrate 410 with the sealant 405 makes a structure in which a light-emitting element 418 is provided in the space 407 enclosed by the substrate 410, the sealing substrate 404, and the sealant 405. Note that the space 407 may be filled with an inert gas (e.g., nitrogen or argon) or with the sealant 405.

Note that as the sealant 405, an epoxy-based resin is preferably used. A material used for these is desirably a material which does not transmit moisture or oxygen as possible. As the sealing substrate 404, a plastic substrate made of fiberglass-reinforced plastics (FRP), polyvinyl fluoride (PVF), polyester, an acrylic resin, or the like can be used besides a glass substrate or a quartz substrate.

In the above-described manner, a light-emitting device manufactured using a light-emitting element of an embodiment of the present invention can be obtained.

Since the light-emitting element described in Embodiment 1 or Embodiment 2 is used for the light-emitting device of the present invention, the light-emitting device having favorable characteristics can be obtained. Specifically, since a light-emitting element with high emission efficiency is included, a light-emitting device that has reduced power consumption and can be driven for a long time can be obtained.

Figure 13A:
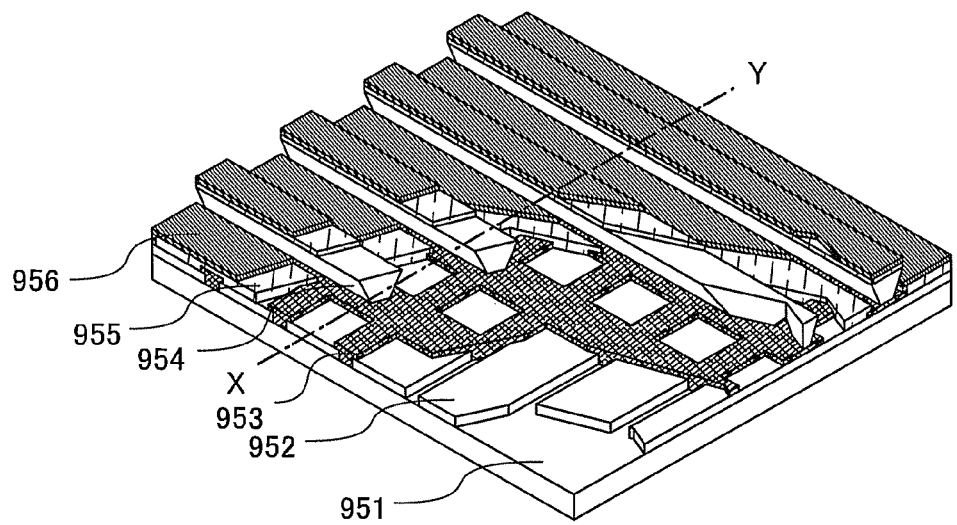
FIGS. 13A and 13B illustrate a light-emitting device according to Embodiment.
Figure 13B:
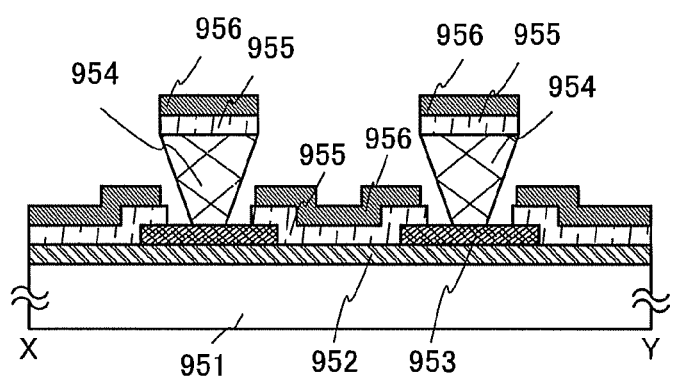

Although an active matrix light-emitting device which controls driving of a light-emitting element with a transistor is described above, the light-emitting device may be a passive matrix light-emitting device. FIGS. 13A and 13B illustrate a passive matrix light-emitting device manufactured according to the present invention. FIG. 13A is a perspective view illustrating the passive matrix light-emitting, and FIG. 13B is a cross-sectional view of FIG. 13A taken along a line X-Y. In FIGS. 13A and 13B, an electrode 952 and an electrode 956 are provided over a substrate 951, and a layer 955 including a light-emitting substance is provided between the electrode 952 and the electrode 956. An end portion of the electrode 952 is covered with an insulating layer 953. A partition layer 954 is provided over the insulating layer 953.

The sidewalls of the partition layer 954 are aslope such that the distance between both sidewalls is gradually narrowed toward the surface of the substrate. That is, a cross section in a short side of the partition layer 954 is a trapezoidal shape, and a lower side (the side which faces in the direction similar to a plane direction of the insulating layer 953 and is in contact with the insulating layer 953) is shorter than an upper side (the side which faces in the direction similar to a plane direction of the insulating layer 953 and is not in contact with the insulating layer 953). By the partition layer 954 provided in this manner, defects of the light-emitting element due to static charge and the like can be prevented.

The layer 955 including a light-emitting substance which is interposed between the electrode 952 and the electrode 956 is formed in a manner similar to that in Embodiment 1 or Embodiment 2.

Since the light-emitting element described in Embodiment 1 or Embodiment 2 is used for the light-emitting device of the present invention, the light-emitting device of the present invention of the present invention having favorable characteristics can be obtained. Specifically, since a light-emitting element with high emission efficiency is included, a light-emitting device that has reduced power consumption and can be driven for a long time can be obtained.

Embodiment 4

In Embodiment 4, electronic devices of the present invention each of which includes the light-emitting device described in Embodiment 3 as part thereof, are described. The electronic devices of the present invention each have a display portion which includes the light-emitting element described in Embodiment 1 or Embodiment 2, consumes less power, and can drive for a long period of time. In addition, the electronic devices of the present invention each include a display portion having excellent color reproducibility.

As examples of the electronic devices to which the light-emitting element of an embodiment of the present invention is applied, the following are given: cameras such as video cameras or digital cameras, goggle type displays, navigation systems, audio reproducing devices (e.g., car audio components and audio components), computers, game machines, portable information terminals (e.g., mobile computers, cellular phones, portable game machines, and electronic books), and image reproducing devices provided with recording media (specifically, a device capable of reproducing recording media such as digital versatile discs (DVDs) and provided with a display device that can display the image). Specific examples of such electronic devices are illustrated in FIGS. 14A to 14D.

Figure 14A:
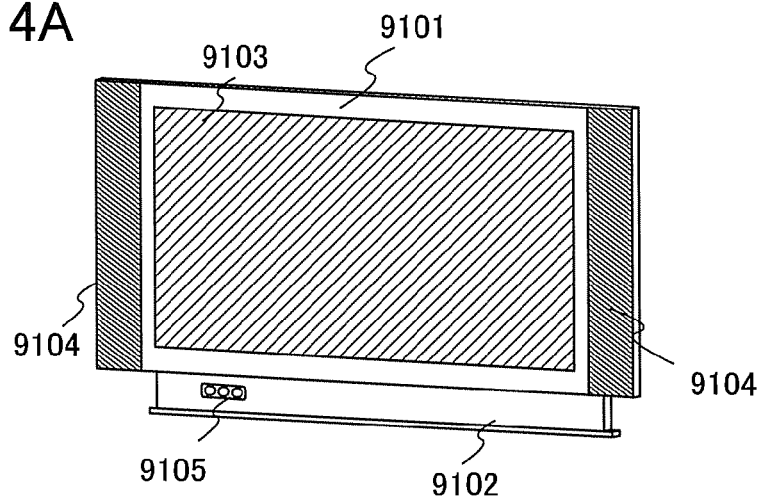
FIGS. 14A to 14D each illustrate an electronic device according to Embodiment.

FIG. 14A illustrates a television set of the present invention, which includes a chassis 9101, a support 9102, a display portion 9103, speaker portions 9104, a video input terminal 9105, and the like. In the display portion 9103 of this television set, light-emitting elements similar to those described in Embodiment 1 or Embodiment 2 are arranged in a matrix. The light-emitting elements are characterized by high emission efficiency. The display portion 9103 including the light-emitting elements has similar features and enables the television set to exhibit light emission with high luminance and a decrease in power consumption. Further, the television set has high reliability and can withstand long-term use. The television set according to the present invention, which achieves lower power consumption and higher image quality, can be provided as a product that is suitable for any residential environment.

Figure 14B:
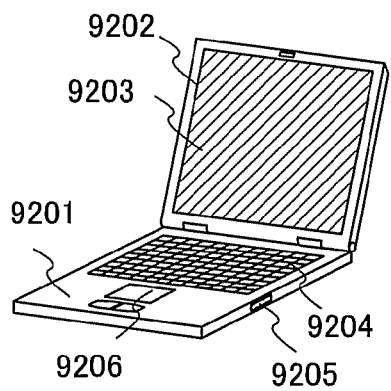

FIG. 14B shows a computer according to the present invention, which includes a main body 9201, a chassis 9202, a display portion 9203, a keyboard 9204, an external connection port 9205, a pointing device 9206, and the like. In the computer, the display portion 9203 has light-emitting elements similar to those described in Embodiment 1 or Embodiment 2, which are arranged in a matrix. The light-emitting elements are characterized by high emission efficiency. The display portion 9203 including the light-emitting elements has similar features to achieve light emission with high luminance and a decrease in power consumption. Further, the computer has high reliability and can withstand long-term use. The computer according to the present invention, which achieves lower power consumption and higher image quality, can be provided as a product that is suitable for the environment.

Figure 14C:
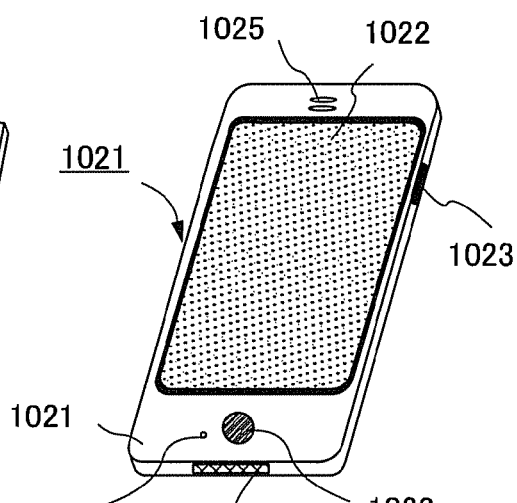

FIG. 14C illustrates a cellular phone 1020 according to the present invention, which includes a display portion 1022 incorporated in a housing 1021, an operation button 1023, an external connection port 1024, a speaker 1025, a microphone 1026 and the like. Information can be inputted when the display portion 1022 is touched with a finger or the like. In addition, operations such as making calls and composing mails can be conducted when a person touches the display portion 1022 with his/her finger or the like. In the cellular phone, the display portion 1022 has light-emitting elements similar to those described in Embodiment 1 or Embodiment 2, which are arranged in a matrix. The light-emitting elements are characterized by high emission efficiency. The display portion 1022 which includes the light-emitting elements has similar features to achieve light emission with high luminance and reduction in power consumption. Further, the cellular phone has high reliability and can withstand long-term use. The cellular phone according to the present invention, which achieves lower power consumption and higher image quality, can be provided as a product that is suitable for portable use.

Figure 14D:
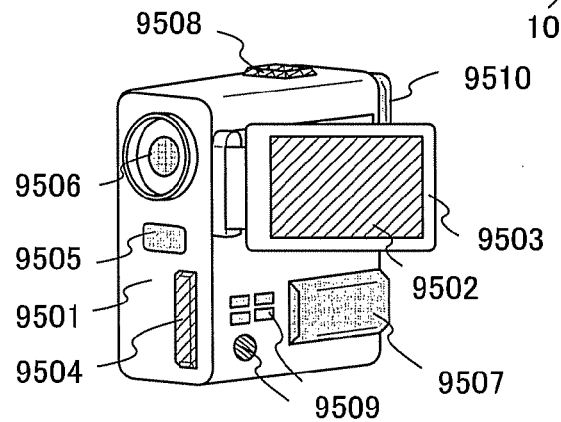

FIG. 14D illustrates a camera according to the present invention, which includes a main body 9501, a display portion 9502, a chassis 9503, an external connection port 9504, a remote control receiving portion 9505, an image receiving portion 9506, a battery 9507, an audio input portion 9508, operation keys 9509, an eye piece portion 9510, and the like. In the camera, the display portion 9502 has light-emitting elements similar to those described in Embodiment 1 or Embodiment 2, which are arranged in a matrix. The light-emitting elements have such an advantage that the emission efficiency is high and long-time driving is possible. The display portion 9502 including the light-emitting elements has similar features to achieve light emission with high luminance and a decrease in power consumption. Further, the camera has high reliability and can withstand long-term use. The camera according to the present invention, which achieves lower power consumption and higher image quality, can be provided as a product that is suitable for portable use.

As thus described, application range of the light-emitting device of the present invention is quite wide, and this light-emitting device can be applied to electronic devices of a variety of fields. Use of the light-emitting element of an embodiment of the present invention can provide electronic devices each including a display portion having high emission efficiency, capability of long-time driving, and consuming low power.

Moreover, the light-emitting device of the present invention can be used as a lighting device. An embodiment in which the light-emitting element of the present invention is used for a lighting device will be described with reference to FIG. 15.

Figure 15:
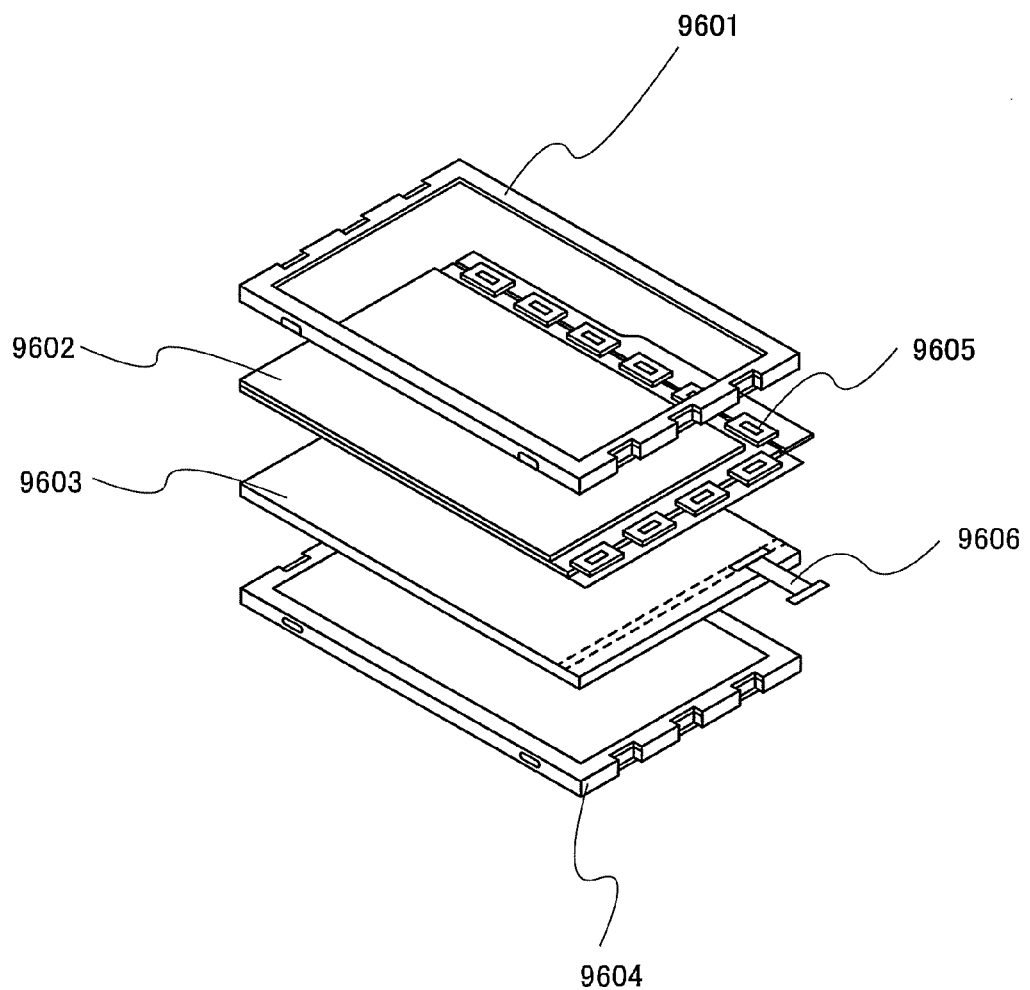
FIG. 15 illustrates a lighting device according to Embodiment.

FIG. 15 illustrates an example of a liquid crystal display device using the light-emitting device of an embodiment of the present invention as a backlight. The liquid crystal display device illustrated in FIG. 15 includes a chassis 9601, a liquid crystal layer 9602, a backlight 9603, and a housing 9604, and the liquid crystal layer 9602 is connected to a driver IC 9605. The light-emitting device of the present invention is used as the backlight 9603, and a current is supplied through a terminal 9606.

With the use of the light-emitting device of the present invention as the backlight of the liquid crystal display device, a backlight with high emission efficiency and reduced power consumption can be obtained. Moreover, since the light-emitting device of the present invention is a lighting device of surface light emission and the enlargement of the light-emitting device is possible, the backlight can be made larger and the liquid crystal display device can also have a larger area. Moreover, since the light-emitting device of the present invention is thin and consumes less power, reduction in thickness and power consumption of the display device is possible. Further, since the light-emitting device of the present invention can exhibit light emission with high luminance, a liquid crystal display device using the light-emitting device of the present invention can also exhibit light emission with high luminance.

Figure 16:
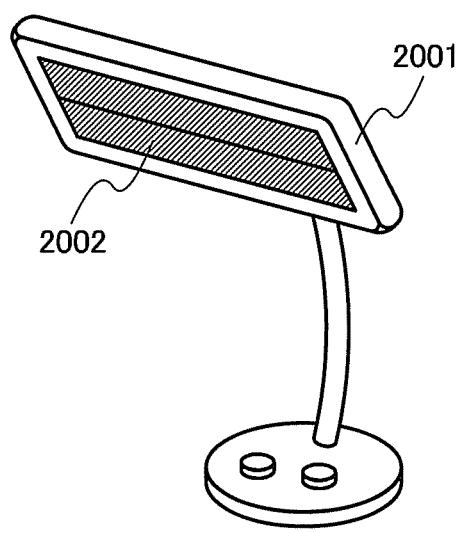
FIG. 16 illustrates a lighting device according to Embodiment.

FIG. 16 illustrates an example in which a light-emitting device to which the present invention is applied is used as a table lamp, which is one of lighting devices. A table lamp shown in FIG. 16 has a chassis 2001 and a light source 2002, and the light-emitting device of the present invention is used as the light source 2002. Since the light-emitting device of the present invention has high emission efficiency, can be driven for a long time, and has reduced power consumption, the table lamp also has high emission efficiency, can be driven for a long time, and has reduced power consumption.

Figure 17:
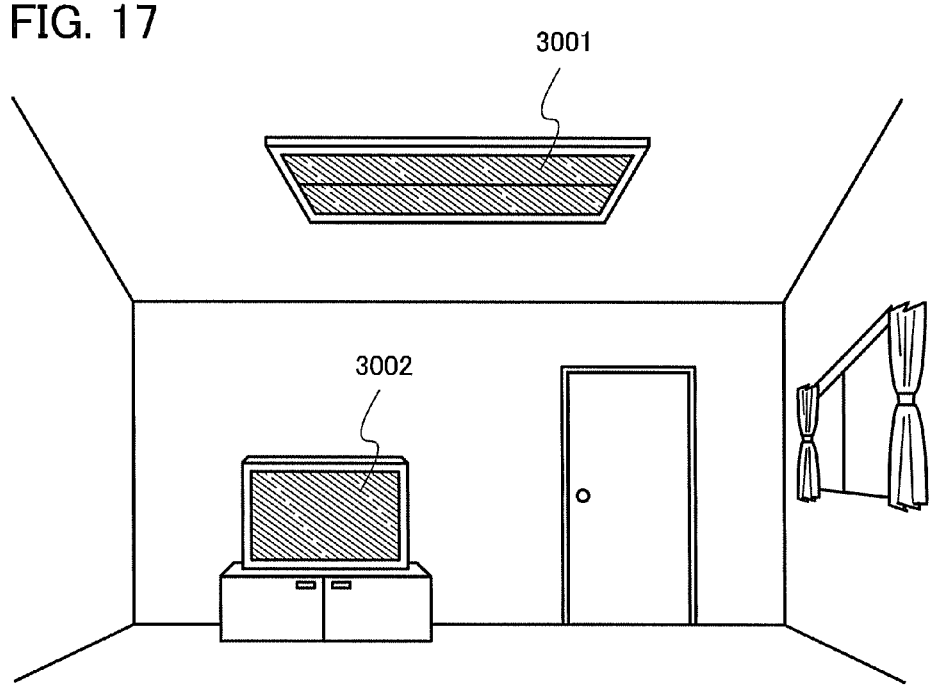
FIG. 17 illustrates a lighting device according to Embodiment.

FIG. 17 illustrates an example in which a light-emitting device to which the present invention is applied is used as an indoor lighting device 3001.

Since the light-emitting device of the present invention can be enlarged, the light-emitting device can be used as a large-area lighting device. Further, since the light-emitting device of the present invention has a thin shape and consumes reduced power, the light-emitting device of the present invention can be used as a lighting device having a thin shape and consuming low power. A television set 3002 relating to the present invention as shown in FIG. 14A is placed in a room where the light emitting device to which the present invention is applied is used as the indoor lighting device 3001. Thus, public broadcasting and movies can be watched. In such the case, since both of the devices consume reduced power, a powerful image can be watched in a bright room without concern about electricity charges. Further, a lighting device to which the light-emitting device of the present invention is applied has high reliability and can withstand long-term use.

Example 1

A method for manufacturing a light-emitting element of an embodiment of the present invention, and measurement results of element characteristics thereof are described. Structural formulas of organic compounds used in Example 1 are shown below.

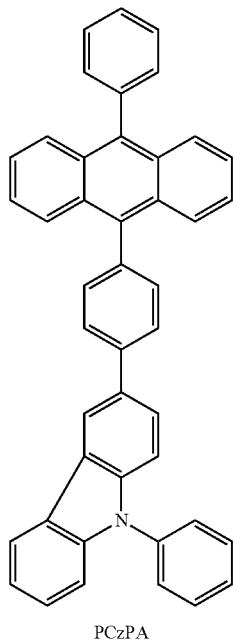

PCzPA (11)

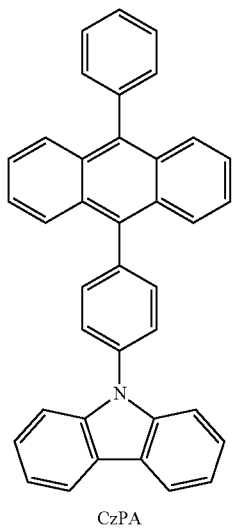

CzPA (12)

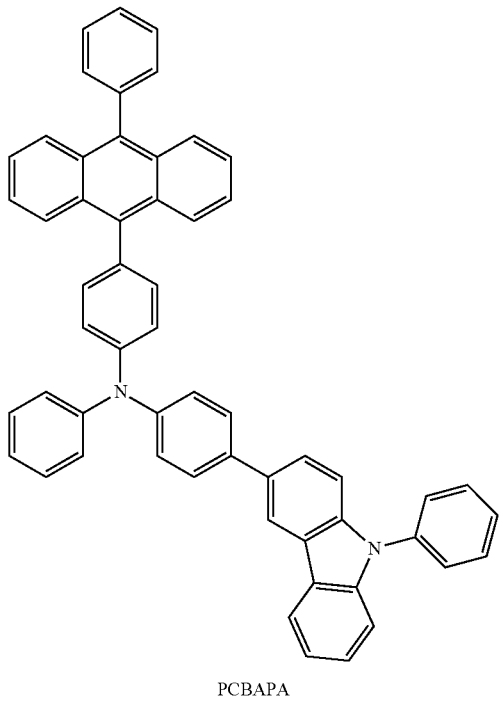

PCBAPA (13)

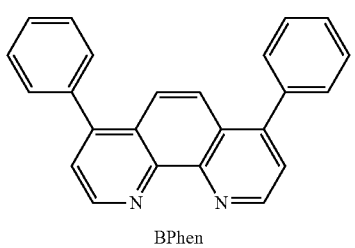

BPhen (14)

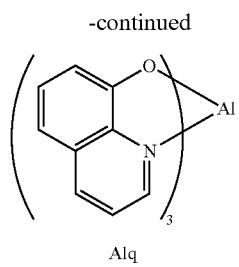

(15)

Alq

Table 1 summarizes the manufactured light-emitting elements.

TABLE 1

| | 1502 | 1512 | 1313a | 1513b | 1513c | 1514a | 1514b | 1515 | 1504 |
|---|---|---|---|---|---|---|---|---|---|
| Light-Emitting Element 1 | ITSO 110 nm | PCzPA:MoOx (=4:1) 50 nm | PCzPA:PCBAPA (=1:0.01) 20 nm | PCzPA:PCBAPA (=1:0.07) 30 nm | — | Alq 10 nm | Bphen 20 nm | LiF 1 nm | Al 200 nm |
| Light-Emitting Element 2 | ITSO 110 nm | CzPA:MoOx (=4:1) 50 nm | PCzPA:PCBAPA (=1:0.01) 30 nm | CzPA:PCBAPA (=1:0.1) 20 nm | CzPA:PCBAPA (=1:0.05) 10 nm | PCBAPA 10 nm | Bphen 20 nm | LiF 1 nm | Al 200 nm |
| Light-Emitting Element 3 | ITSO 110 nm | PCzPA:MoOx (=4:1) 50 nm | PCzPA:CzPA: PCBAPA (=0.5:0.5:0.01) 30 nm | PCzPA:CzPA: PCBAPA (=0.5:0.5:0.1) 20 nm | CzPA:PCBAPA (=1:0.05) 20 nm | Alq 10 nm | Bphen 20 nm | LiF 1 nm | Al 200 nm |

(Manufacture of Light-Emitting Element 1)

Figure 6A:
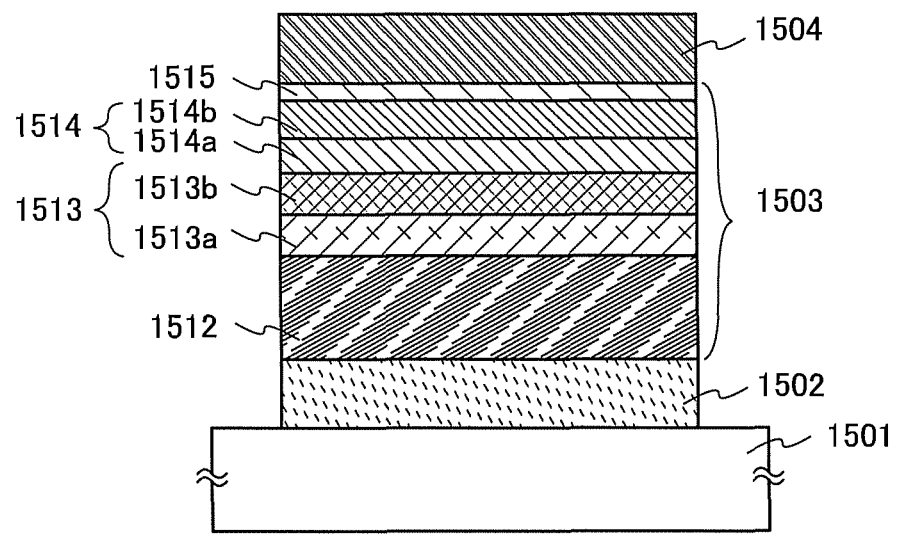
FIGS. 6A and 6B illustrate a light-emitting element according to Example.
Figure 6B:
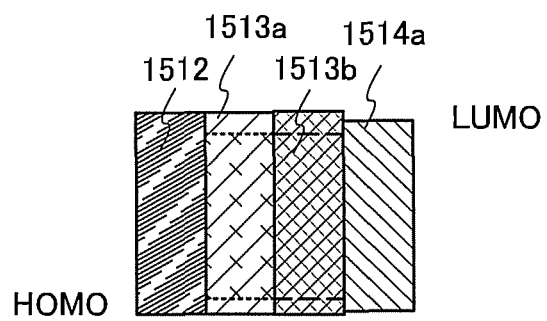

FIG. 6A illustrates an element structure of Light-emitting element 1 described in Example 1 and FIG. 6B illustrates part of a band structure thereof. Light-emitting element 1 includes an EL layer 1503 having a stack of plural layers over a first electrode 1502. In Example 1, the EL layer 1503 includes a structure in which a hole-transport layer 1512, a light-emitting layer 1513 (a first light-emitting layer 1513a and a second light-emitting layer 1513b), an electron-transport layer 1514, and an electron-injection layer 1515 are stacked in that order.

In Light-emitting element 1, the hole-transport layer 1512, the first light-emitting layer 1513a, and the second light-emitting layer 1513b are each formed using organic materials which are almost the same in HOMO level and LUMO level. To the first light-emitting layer 1513a and the second light-emitting layer 1513b, the same light-emitting substances are added as guest materials. The weight ratio of the host material to the light-emitting substance added to the first light-emitting layer 1513a is 1:0.01. The weight ratio of the host material to the light-emitting substance added to the second light-emitting layer 1513b is 1:0.07.

Further, the electron-transport layer 1514 includes two layers of a first electron-transport layer 1514a and a second electron-transport layer 1514b. The LUMO level of the first electron-transport layer 1514a in contact with the second light-emitting layer 1513b is deeper than (the absolute value of the LUMO level thereof is larger than that of) the LUMO level of the second light-emitting layer 1513b. Therefore, it is estimated that a barrier relating to the injection of electrons be high. FIG. 6B shows the correlation of bands included in the hole-transport layer 1512, the first light-emitting layer 1513a, the second light-emitting layer 1513b, and the first electron-transport layer 1514a of Light-emitting element 1.

Next, a method for manufacturing Light-emitting element 1 is described. First, indium oxide-tin oxide containing silicon oxide was deposited on the glass substrate 1501 by a sputtering method, so that the first electrode 1502 was formed. Note that the thickness was 110 nm and the electrode area was 2 mm×2 mm.

The substrate provided with the first electrode 1502 was fixed to a substrate holder provided in a vacuum deposition apparatus such that a side of the substrate where the first electrode 1502 was provided faced downward, and then the pressure was reduced to about $10^{-4}$ Pa. After that, the hole-transport layer 1512 was formed on the first electrode 1502. The hole-transport layer 1512 was formed using a film obtained by co-evaporation of 9-phenyl-3-[4-(10-phenyl-9-anthryl)phenyl]-9H-carbazol (abbreviation: PCzPA) and molybdenum(VI) oxide. The thickness of the hole-transport layer 1512 was set to 50 nm, and the evaporation rate was adjusted such that the weight ratio of PCzPA to molybdenum (VI) oxide could be 4:1 (=PCzPA:molybdenum oxide). Note that the co-evaporation method refers to an evaporation method in which evaporation is carried out from a plurality of evaporation sources at the same time in one treatment chamber.

Next, the first light-emitting layer 1513a was formed on the hole-transport layer 1512. The first light-emitting layer 1513a was formed using a film obtained by co-evaporation of PCzPA and 4-(10-phenyl-9-anthryl)-4'-(9-phenyl-9H-carbazol-3-yl)triphenylamine (abbreviation: PCBAPA). The thickness of the first light-emitting layer 1513a was set to 20 nm, and the evaporation rate was adjusted such that the weight ratio of PCzPA to PCBAPA could be 1:0.01 (=PCzPA:PCBAPA).

Next, the second light-emitting layer 1513b was formed on the first light-emitting layer 1513a. The second light-emitting layer 1513b was formed using a film obtained by co-evaporation of 9-[4-(10-phenyl-9-anthryl)phenyl]-9H-carbazole (abbreviation: CzPA) and PCBAPA. The thickness of the second light-emitting layer 1513b was set to 30 nm, and the evaporation rate was adjusted such that the weight ratio of CzPA to PCBAPA could be 1:0.07 (=CzPA:PCBAPA).

The electron-transport layer 1514 was formed on the second light-emitting layer 1513b. The electron-transport layer 1514 was formed using a stacked-layer film which is formed such that tris(8-quinolinolato)aluminum (abbreviation: Alq) was deposited to a thickness of 10 nm and bathophenanthroline (abbreviation: BPhen) was deposited thereon to a thickness of 20 nm.

The electron-injection layer 1515 was formed on the electron-transport layer 1514. The electron-injection layer 1515 was formed using lithium fluoride (LiF), and the thickness of the electron-injection layer 1515 was set to 1 nm.

Finally, the second electrode 1504 was formed on the electron-injection layer 1515. The second electrode 1504 was formed using aluminum, and the thickness of the second electrode 1504 was set to 200 nm. Thus, Light-emitting element 1 was manufactured.

Sealing was performed in a glove box under a nitrogen atmosphere so that Light-emitting element 1 of the present invention which is obtained as described above was not exposed to the atmosphere, and then operation characteristics of this light-emitting element were measured. Note that the measurement was carried out at room temperature (in an atmosphere kept at 25° C.).

Figure 8:
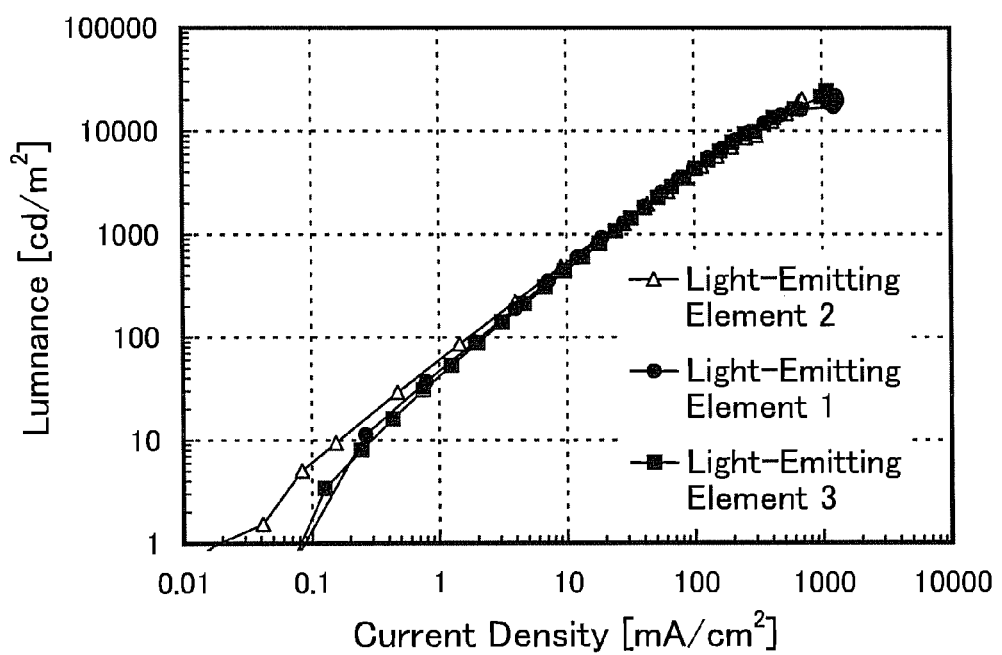
FIG. 8 illustrates current density-luminance characteristics of Light-emitting elements 1 to 3.
Figure 9:
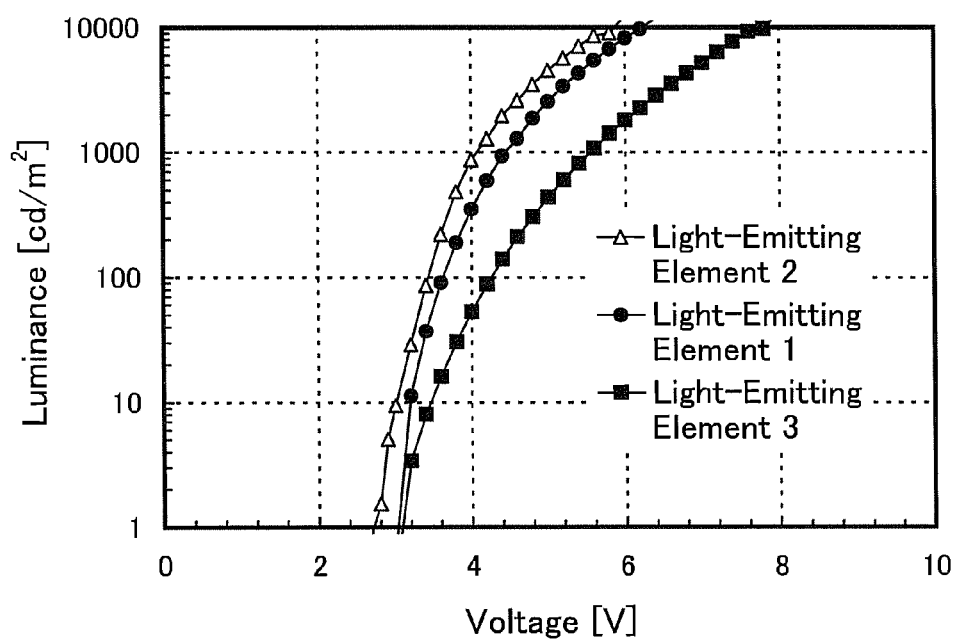
FIG. 9 illustrates voltage-luminance characteristics of Light-emitting elements 1 to 3.
Figure 10:
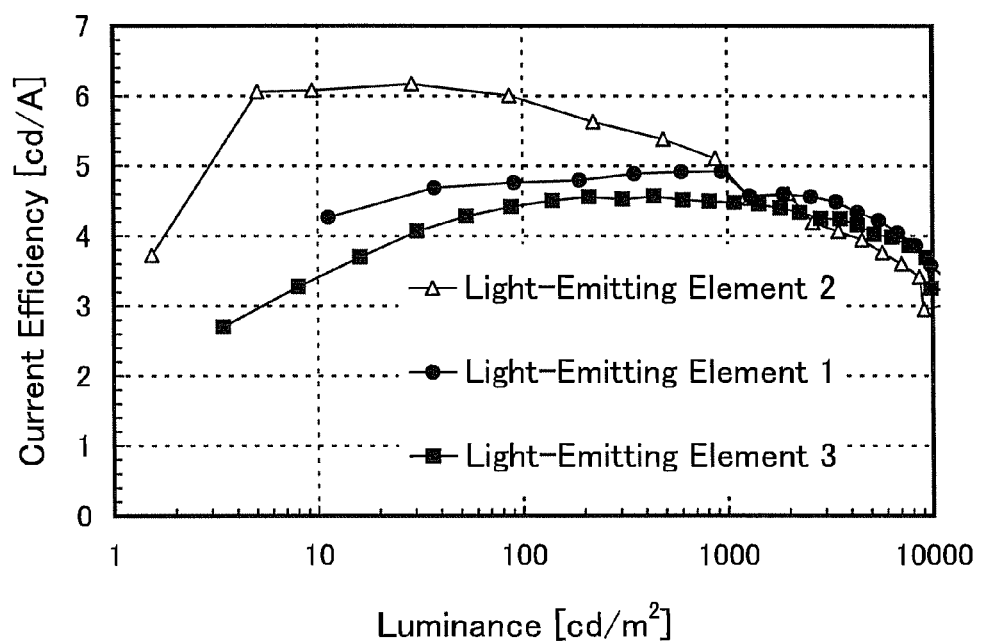
FIG. 10 illustrates luminance-current efficiency characteristics of Light-emitting elements 1 to 3.
Figure 11:
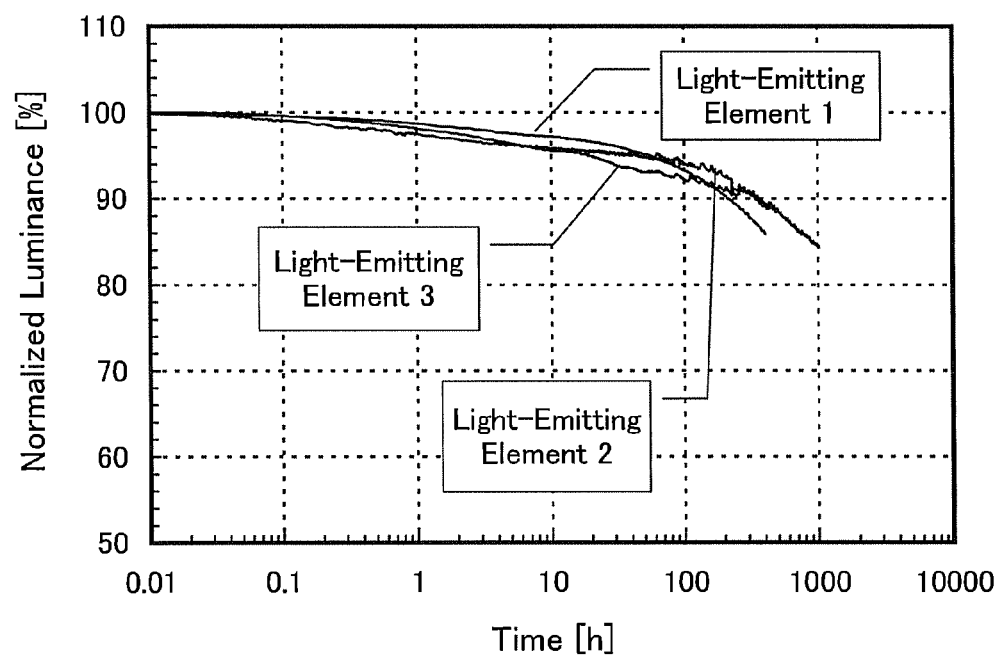
FIG. 11 illustrates results of a continuous lighting test in which Light-emitting elements 1 to 3 are continuously lit by constant current driving.

FIG. 8 illustrates current density-luminance characteristics of Light-emitting element 1. FIG. 9 illustrates voltage-luminance characteristics. FIG. 10 illustrates luminance-current efficiency characteristics. FIG. 11 illustrates time dependence of normalized luminance of Light-emitting element 1 when the initial luminance was set to approximately 1000 cd/m$^2$.

The CIE chromaticity coordinate of Light-emitting element 1 at a luminance of 1000 cd/m$^2$ was x=0.15, y=0.14, and blue light is emitted. In addition, the current efficiency, the voltage, and the current density at the luminance of 1000 cd/m$^2$ were 4.9 cd/A, 4.4 V, and 19.0 mA/cm$^2$, respectively. In addition, according to FIG. 11, Light-emitting element 1 exhibited 86% of the initial luminance even when 400 hours have passed, and it is apparent Light-emitting element 1 is a long-lifetime light-emitting element.

As described above, a long-lifetime light-emitting element with high efficiency can be obtained by application of the present invention.

(Manufacture of Light-Emitting Element 2)

Figure 7A:
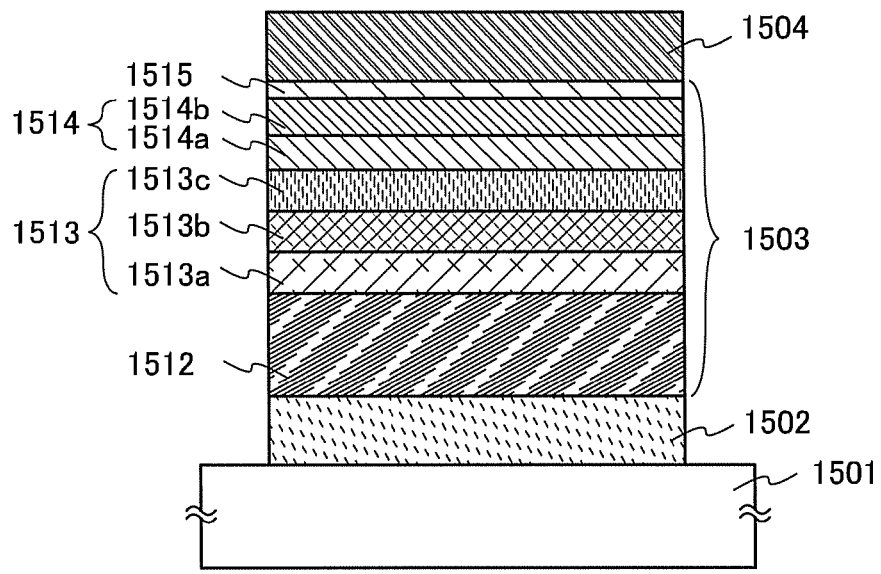
FIGS. 7A to 7C illustrate a light-emitting element according to Example.
Figure 7B:
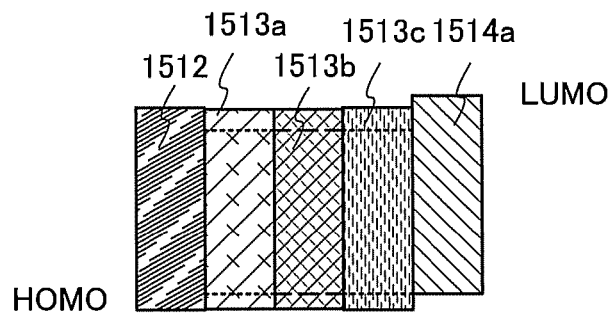

FIG. 7A illustrates an element structure of Light-emitting element 2 described in Example 1 and FIG. 7B illustrates part of a band structure thereof. Light-emitting element 2 includes an EL layer 1503 having a stack of plural layers over a first electrode 1502. In Example 1, the EL layer 1503 includes a structure in which a hole-transport layer 1512, a light-emitting layer 1513 (a first light-emitting layer 1513a, a second light-emitting layer 1513b, and a third light-emitting layer 1513c), an electron-transport layer 1514, and an electron-injection layer 1515 are stacked in that order.

In Light-emitting element 2, the hole-transport layer 1512, the first light-emitting layer 1513a, the second light-emitting layer 1513b, and the third light-emitting layer 1513c are each formed using organic materials which are almost the same in HOMO level and LUMO level. Note that a host material included in the third light-emitting layer 1513c has a high electron-transport property. To the first light-emitting layer 1513a, the second light-emitting layer 1513b, and the third light-emitting layer 1513c, the same light-emitting substances are added as guest materials. The weight ratio of the host material to the light-emitting substance added to the first light-emitting layer 1513a is 1:0.01, and the weight ratio of the host material to the light-emitting substance added to the second light-emitting layer 1513b is 1:0.1. The weight ratio of the host material to the light-emitting substance added to the third light-emitting layer 1513c is 1:0.05.

Further, the electron-transport layer 1514 includes two layers of a first electron-transport layer 1514a and a second electron-transport layer 1514b. The LUMO level of the first electron-transport layer 1514a in contact with the third light-emitting layer 1513c is shallower than (the absolute value of the LUMO level thereof is smaller than that of) the LUMO level of the third light-emitting layer 1513c. Therefore, it is estimated that a barrier relating to the injection of electrons be low. FIG. 7B shows the correlation of bands included in the hole-transport layer 1512, the first light-emitting layer 1513a, the second light-emitting layer 1513b, the third light-emitting layer 1513c, and the first electron-transport layer 1514a of Light-emitting element 2.

Subsequently, a method for manufacturing Light-emitting element 2 is described. The hole-transport layer 1512 was formed on the first electrode 1502 with the use of a substrate which is similar to that used for Light-emitting element 1. The hole-transport layer 1512 was formed using a film obtained by co-evaporation of CzPA and molybdenum(VI) oxide. The thickness of the hole-transport layer 1512 was set to 50 nm, and the evaporation rate was adjusted such that the weight ratio of CzPA to molybdenum(VI) oxide could be 4:1 (=CzPA:molybdenum oxide).

The first light-emitting layer 1513a was formed on the hole-transport layer 1512. The first light-emitting layer 1513a was formed using a film obtained by co-evaporation of PCzPA and PCBAPA. The thickness of the first light-emitting layer 1513a was set to 30 nm, and the evaporation rate was adjusted such that the weight ratio of to PCzPA and PCBAPA could be 1:0.01 (=PCzPA:PCBAPA).

The second light-emitting layer 1513b was formed on the first light-emitting layer 1513a. The second light-emitting layer 1513b was formed using a film obtained by co-evaporation of PCzPA and PCBAPA. The thickness of the second light-emitting layer 1513b was set to 20 nm, and the evaporation rate was adjusted such that the weight ratio of to PCzPA and PCBAPA could be 1:0.1 (=PCzPA:PCBAPA).

The third light-emitting layer 1513c was formed on the second light-emitting layer 1513b. The third light-emitting layer 1513c was formed using a film obtained by co-evaporation of CzPA and PCBAPA. The thickness of the third light-emitting layer 1513c was set to 10 nm, and the evaporation rate was adjusted such that the weight ratio of CzPA to PCBAPA could be 1:0.05 (=CzPA:PCBAPA).

The electron-transport layer 1514 was formed on the third light-emitting layer 1513c. The electron-transport layer 1514 was formed using a stacked-layer film which is formed such that PCBAPA was deposited to a thickness of 10 nm and BPhen was deposited thereon to a thickness of 20 nm.

The electron-injection layer 1515 and the second electrode 1504 were formed by methods similar to those for Light-emitting element 1. Thus, Light-emitting element 2 was manufactured.

Sealing was performed in a glove box under a nitrogen atmosphere so that Light-emitting element 2 of the present invention which is obtained as described above was not exposed to the atmosphere, and then operation characteristics of this light-emitting element were measured. Note that the measurement was carried out at room temperature (in an atmosphere kept at 25° C.).

FIG. 8 illustrates current density-luminance characteristics of Light-emitting element 2. FIG. 9 illustrates voltage-luminance characteristics. FIG. 10 illustrates luminance-current efficiency characteristics. FIG. 11 illustrates time dependence of normalized luminance of Light-emitting element 2 when the initial luminance was set to approximately 1000 cd/m$^2$.

The CIE chromaticity coordinate of Light-emitting element 2 at a luminance of 1000 cd/m$^2$ was x=0.15, y=0.15, and blue light is emitted. In addition, the current efficiency, the voltage, and the current density at the luminance of 1000 cd/m$^2$ were 5.1 cd/A, 4.0 V, and 17.0 mA/cm$^2$, respectively. In addition, according to FIG. 11, Light-emitting element 2 exhibited 89% of the initial luminance even when 400 hours have passed, and it is apparent Light-emitting element 2 is a long-lifetime light-emitting element.

As described above, a long-lifetime light-emitting element with high efficiency can be obtained by application of the present invention.

(Manufacture of Light-Emitting Element 3)

Figure 7C:
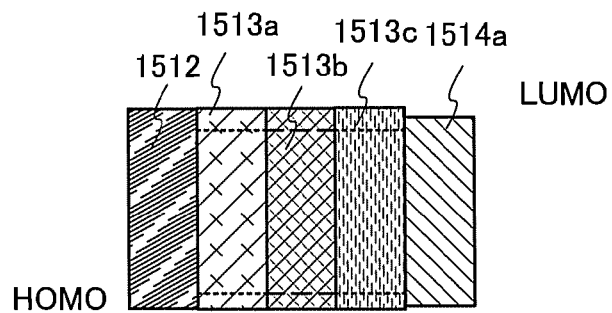

FIG. 7A illustrates an element structure of Light-emitting element 3 to be described in Example 1 and FIG. 7C illustrates part of a band structure thereof. Light-emitting element 3 includes an EL layer 1503 having a stack of plural layers over a first electrode 1502. In Example 1, the EL layer 1503 includes a structure in which a hole-transport layer 1512, a first light-emitting layer 1513a, a second light-emitting layer 1513b, a third light-emitting layer 1513c, an electron-transport layer 1514, and an electron-injection layer 1515 are stacked in that order.

In Light-emitting element 3, the hole-transport layer 1512, the first light-emitting layer 1513a, the second light-emitting layer 1513b, and the third light-emitting layer 1513c are formed using organic materials which are almost the same in HOMO level and LUMO level. Note that two kinds of organic compounds were mixed and used for host materials included in the first light-emitting layer 1513a and the second light-emitting layer 1513b, in order to adjust the electron-transport property. Note also that a host material included in the third light-emitting layer 1513c has a high electron-transport property. To the first light-emitting layer 1513a, the second light-emitting layer 1513b, and the third light-emitting layer 1513c, the same light-emitting substances are added as guest materials. The weight ratio of the host material to the light-emitting substance added to the first light-emitting layer 1513a is 1:0.01, and the weight ratio of the host material to the light-emitting substance added to the second light-emitting layer 1513b is 1:0.1. The weight ratio of the host material to the light-emitting substance added to the third light-emitting layer 1513c is 1:0.05.

Further, the electron-transport layer 1514 includes two layers of a first electron-transport layer 1514a and a second electron-transport layer 1514b. The LUMO level of the first electron-transport layer 1514a in contact with the third light-emitting layer 1513c is deeper than (the absolute value of the LUMO level thereof is larger than that of) the LUMO level of the third light-emitting layer 1513c. Therefore, it is estimated that a barrier relating to the injection of electrons be high. FIG. 7C shows the correlation of bands included in the hole-transport layer 1512, the first light-emitting layer 1513a, the second light-emitting layer 1513b, the third light-emitting layer 1513c, and the first electron-transport layer 1514a of Light-emitting element 3.

In Light-emitting element 3, a substrate which is similar to that used for Light-emitting element 1 is used, and an electrode formed over the glass substrate 1501 is used as the first electrode 1502 so that the light-emitting element is manufactured. The hole-transport layer 1512, the electron-transport layer 1514, the electron-injection layer 1515, and the second electrode 1504 of Light-emitting element 3 were formed in a manner similar to that of Light-emitting element 1. The light-emitting layer 1513 of Light-emitting element 3 was manufactured by the following method.

The first light-emitting layer 1513a was formed on the hole-transport layer 1512. The first light-emitting layer 1513a was formed using a film obtained by co-evaporation of PCzPA, CzPA, and PCBAPA. The thickness of the first light-emitting layer 1513a was set to 30 nm, and the evaporation rate was adjusted such that the weight ratio of PCzPA to CzPA and PCBAPA could be 0.5:0.5:0.01 (=PCzPA:CzPA:PCBAPA).

The second light-emitting layer 1513b was formed on the first light-emitting layer 1513a. The second light-emitting layer 1513b was formed using a film obtained by co-evaporation of PCzPA, CzPA, and PCBAPA. The thickness of the second light-emitting layer 1513b was set to 30 nm, and the evaporation rate was adjusted such that the weight ratio of PCzPA to CzPA and PCBAPA could be 0.5:0.5:0.1 (=PCzPA:CzPA:PCBAPA).

The third light-emitting layer 1513c was formed on the second light-emitting layer 1513b. The third light-emitting layer 1513c was formed using a film obtained by co-evaporation of CzPA and PCBAPA. The thickness of the third light-emitting layer 1513c was set to 20 nm, and the evaporation rate was adjusted such that the weight ratio of CzPA to PCBAPA could be 1:0.05 (=CzPA:PCBAPA).

Sealing was performed in a glove box under a nitrogen atmosphere so that Light-emitting element 3 of the present invention which is obtained as described above was not exposed to the atmosphere, and then operation characteristics of this light-emitting element were measured. Note that the measurement was carried out at room temperature (in an atmosphere kept at 25° C.).

FIG. 8 illustrates current density-luminance characteristics of Light-emitting element 3. FIG. 9 illustrates voltage-luminance characteristics. FIG. 10 illustrates luminance-current efficiency characteristics. FIG. 11 illustrates time dependence of normalized luminance of Light-emitting element 3 when the initial luminance was set to approximately 1000 cd/m$^2$.

The CIE chromaticity coordinate of Light-emitting element 3 at a luminance of 1000 cd/m$^2$ was x=0.15, y=0.16, and blue light is emitted. In addition, the current efficiency, the voltage, and the current density at the luminance of 1000 cd/m$^2$ were 4.5 cd/A, 5.6 V, and 24.2 mA/cm$^2$, respectively. In addition, according to FIG. 11, Light-emitting element 3 exhibited 89% of the initial luminance even when 400 hours have passed and exhibited 85% of the initial luminance even when 1000 hours have passed, and it is apparent Light-emitting element 3 is a long-lifetime light-emitting element.

As described above, a long-lifetime light-emitting element with high efficiency can be obtained by application of the present invention.

Synthesis of 9-phenyl-3-[4-(10-phenyl-9-anthryl)phenyl]-9H-carbazol (abbreviation: PCzPA)

Synthetic scheme of PCzPA used in Example 1 is shown in (B-1).

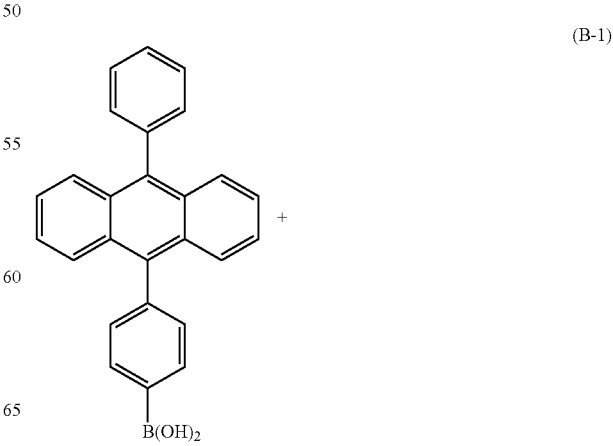

(B-1)

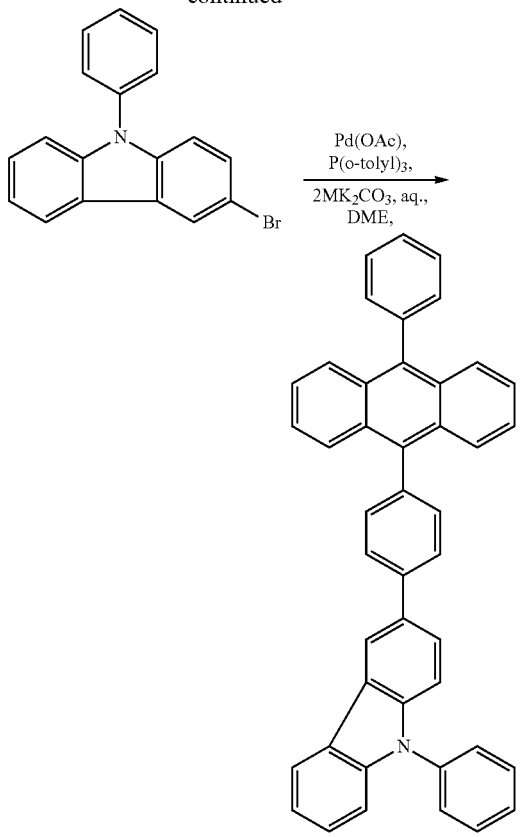

In a 100-mL three-neck flask were stirred 2.6 g (7.0 mmol) of 4-(10-phenyl-9-anthryl)phenylboronic acid, 2.3 g (7.0 mmol) of 3-bromo-9-phenyl-9H-carbazole, 2.0 mg (10 μmol) of palladium(II) acetate (abbreviation: Pd(OAc)$_2$), 6.0 mg (20 μmol) of tris(o-tolyl)phosphine (abbreviation: P(o-tolyl)$_3$), 5 mL (10 mmol) of potassium carbonate aqueous solution (2 mol/L), and 20 mL of 1,2-dimethoxyethane (abbreviation: DME) in a nitrogen atmosphere for 6.5 hours while being heated at 90° C. The temperature of this suspending solution was cooled to room temperature, and then, 200 mL of toluene was added, and the mixture was filtered through Florisil (produced by Wako Pure Chemical Industries, Ltd., Catalog No. 540-00135), alumina, and celite (produced by Wako Pure Chemical Industries, Ltd., Catalog No. 531-16855). The obtained filtrate was condensed, and acetone and methanol were added thereto, ultrasonic waves were applied thereto, and then recrystallization thereof was performed. Accordingly, 3.8 g of a powdery light-yellow solid of 9-phenyl-3-[4-(10-phenyl-9-anthryl)phenyl]-9H-carbazol (abbreviation: PCzPA), which was the object of the synthesis, was obtained in a yield of 95%.

Note that the obtained PCzPA was measured by $^1$H NMR. The measurement data are shown below. $^1$H NMR (300 MHz, CDCl$_3$): δ (ppm)=7.32-7.98 (m, 27H), 8.25 (d, J=7.8 Hz, 1H), 8.55 (d, J=1.5 Hz, 1H).

Example 2

In Example 2, the HOMO levels and the LUMO levels of the materials used for the light-emitting element which is an embodiment of the present invention, and a method for measuring the HOMO levels and the LUMO levels are described. Note that a HOMO level refers to a highest occupied molecular orbital level and a LUMO level refers to a lowest unoccupied molecular orbital level.

Table 2 shows the HOMO levels and the LUMO levels of the organic compounds used in Example 1. Note that here, the HOMO levels and the LUMO levels which are obtained by cyclic voltammetry (CV) measurement are shown.

TABLE 2

| Material | HOMO (ev) | LUMO (eV) |
|---|---|---|
| Alq | −5.58 | −2.69 |
| Bphen | — | −2.66 |
| CzPA | −5.79 | −2.73 |
| PCBAPA | −5.44 | −2.70 |
| PCzPA | −5.79 | −2.70 |

An embodiment of a method for measuring the HOMO levels and the LUMO levels by cyclic voltammetry (CV) measurement is described.

An oxidation-reduction characteristic was explored by a cyclic voltammetry (CV) measurement. Note that an electrochemical analyzer (ALS model 600A or 600C, manufactured by BAS Inc.) was used for the measurement.

A platinum electrode (manufactured by BAS Inc., PTE platinum electrode) was used as a working electrode, a platinum electrode (manufactured by BAS Inc., Pt counter electrode for VC-3, (5 cm)) was used as an auxiliary electrode, and an Ag/Ag$^+$ electrode (manufactured by BAS Inc., RE-7 non-aqueous reference electrode) was used as a reference electrode. The measurement was conducted at room temperature (20° C. to 25° C.). In addition, the scan rate at the CV measurement was set to 0.1 V/sec in all the measurement.

As for a solution used for the CV measurement, dehydrated dimethylformamide (DMF, product of Sigma-Aldrich Inc., 99.8%, catalog No. 22705-6) was used as a solvent, and tetra-n-butylammonium perchlorate (n-Bu$_4$NClO$_4$, product of Tokyo Chemical Industry Co., Ltd., catalog No. T0836), which was a supporting electrolyte, was dissolved in the solvent such that the concentration of tetra-n-butylammonium perchlorate was 100 mmol/L. Further, the object to be measured was also dissolved in the solvent such that the concentration thereof was 2 mmol/L.

(Calculation of Potential Energy of Reference Electrode with Respect to Vacuum Level)

A method for calculating the potential energy (eV) of a reference electrode (Ag/Ag$^+$ electrode) used for measurement, with respect to a vacuum level is described. Note that the potential energy of the reference electrode (Ag/Ag$^+$ electrode) with respect to the vacuum level corresponds to the Fermi level of the Ag/Ag$^+$ electrode.

The potential energy of the reference electrode (Ag/Ag$^+$ electrode) with respect to the vacuum level may be calculated from a value obtained by measuring a substance whose potential energy from a vacuum level is known, with the use of the reference electrode (Ag/Ag$^+$ electrode).

In particular, it is known that the potential energy of a standard hydrogen electrode from the vacuum level is −4.44 eV (Reference: Toshihiro Ohnishi and Tamami Koyama, High molecular EL material, Kyoritsu shuppan, pp. 64-67). It is also known that the oxidation-reduction potential of ferrocene in methanol is +0.610 [V vs. SHE] with respect to a standard hydrogen electrode (Reference: Christian R. Goldsmith et al., J. Am. Chem. Soc., Vol. 124, No. 1, pp.

83-96, 2002). Therefore, the oxidation-reduction potential of ferrocene with respect to the vacuum level is −4.44+0.61=−3.83 [eV].

As an example, with the use of the reference electrode (Ag/Ag$^+$ electrode) used in Example 2, the oxidation-reduction potential of ferrocene in methanol was measured, which was +0.11 V [vs. Ag/Ag$^+$]. Therefore, the potential energy of the reference electrode (Ag/Ag$^+$ electrode) used in Example 2 from the vacuum level was able to be calculated, which was −3.83−0.11=−4.94 [eV].

(Calculation of HOMO Level)

The potential of a working electrode with respect to a reference electrode is scanned in the range of positive values, and a sample solution which is prepared in the above-described manner is measured by CV measurement. The range of positive values here denotes a range in which an oxidation occurs, typically, a range in which one-electron reaction occurs.

An oxidation peak potential Epa and a reduction peak potential Epc are obtained from CV measurement, and a half-wave potential (a potential intermediate between Epa and Epc) is calculated. The half-wave potential (Epa+Epc)/2 [V vs. Ag/Ag$^+$] represents a measure value of electric energy needed for an oxidation on a working electrode with respect to a reference electrode. Thus, the potential energy with respect to the vacuum level is −4.94−(Epa+Epc)/2 [eV].

(Calculation of LUMO Level)

The potential of a working electrode with respect to a reference electrode is scanned in the range of negative values, and a sample solution which is prepared in the above-described manner is measured by CV measurement. The range of negative values here denotes a range in which a reduction occurs, typically, a range in which one-electron reaction occurs.

A reduction peak potential Epc and an oxidation peak potential Epa are obtained from CV measurement, and a half-wave potential (a potential intermediate between Epc and Epa) is calculated. The half-wave potential (Epa+Epc)/2 [V vs. Ag/Ag$^+$] represents a measure value of electric energy needed for a reduction on a working electrode with respect to a reference electrode. Thus, the potential energy with respect to the vacuum level is −4.94−(Epa+Epc)/2 [eV].

Note that the HOMO level and the LUMO level of a material used for the light-emitting element of an embodiment of the present invention can be measured with a photoelectron spectrometer (AC-2, product of Riken Keiki Co., Ltd.). The HOMO level of a thin-film sample is measured in the atmosphere with a photoelectron spectrometer (AC-2, product of Riken Keiki Co., Ltd.). The absorption spectrum of the thin-film sample is measured with ultraviolet-visible spectrophotometer (V-550, manufactured by JASCO Corporation), and with the use of the absorption spectrum, an absorption edge is obtained from a Tauc plot. An energy gap in a solid state is estimated from the absorption edge. The energy gap is added to the HOMO level, whereby the LUMO level can be estimated.

This application is based on Japanese Patent Application serial no. 2009-131571 filed with Japan Patent Office on May 29, 2009, the entire contents of which are hereby incorporated by reference.

EXPLANATION OF REFERENCE

100: substrate, 101: substrate, 102: first electrode, 103: EL layer, 104: second electrode, 112: hole-transport layer, 113: light-emitting layer, 113a: first light-emitting layer, 113b: second light-emitting layer, 113c: third light-emitting layer, 114: electron-transport layer, 115: electron-injection layer, 401: source side driver circuit, 402: pixel portion, 403: gate side driver circuit, 404: sealing substrate, 405: sealant, 407: space, 408: wiring, 409: FPC (flexible printed circuit), 410: substrate, 411: switching TFT, 412: current control TFT, 413: electrode, 414: insulator, 416: layer including light-emitting substance, 417: electrode, 418: light-emitting element, 423: n-channel TFT, 424: p-channel TFT, 600: electrode, 601: electrode, 800: EL layer, 801: EL layer, 803: charge generation layer, 951: substrate, 952: electrode, 953: insulating layer, 954: partition layer, 955: layer including light-emitting substance, 956: electrode, 1001: electrode, 1002: display portion, 1003: EL layer, 1004: intermediate layer, 1011: first electrode, 1020: a cellular phone, 1022: a display portion, 1021: a housing, 1023: an operation button, 1024: an external connection port, 1025: a speaker, 1026: a microphone, 1012: second electrode, 1501: glass substrate, 1502: electrode, 1503: EL layer, 1504: electrode, 1512: hole-transport layer, 1513: light-emitting layer, 1513a: light-emitting layer, 1513b: light-emitting layer, 1513c: light-emitting layer, 1514: electron-transport layer, 1514a: electron-transport layer, 1514b: electron-transport layer, 1515: electron-injection layer, 2001: housing, 2002: light source, 3001: lighting device, 3002: television device, 9101: housing, 9102: support, 9103: display portion, 9104: speaker portion, 9105: video input terminal, 9201: main body, 9202: housing, 9203: display portion, 9204: keyboard, 9205: external connection port, 9206: pointing device, 9501: main body, 9502: display portion, 9503: housing, 9504: external connection port, 9505: remote control receiving portion, 9506: image receiving portion, 9507: battery, 9508: audio input portion, 9509: operation key, 9510: eye piece portion, 9601: housing, 9602: liquid crystal layer, 9603: backlight, 9604: housing, 9605: driver IC, 9606: terminal

The invention claimed is:

1. A light-emitting element comprising:
    a first electrode;
    a second electrode;
    a hole-transport layer between the first electrode and the second electrode;
    an electron-transport layer between the first electrode and the second electrode; and
    a light-emitting layer between the hole-transport layer and the electron-transport layer,
    wherein the light-emitting layer comprises:
        a first light-emitting layer comprising a first light-emitting substance and being in contact with the hole-transport layer; and
        a second light-emitting layer comprising a second light-emitting substance and being in contact with the first light-emitting layer,
        a third light-emitting layer comprising a third light-emitting substance and being in contact with the second light-emitting layer and the electron-transport layer,
    wherein the first light-emitting layer and the second light-emitting layer are bipolar,
    wherein a hole-transport property of the first light-emitting layer is higher than a hole-transport property of the second light-emitting layer,
    wherein the hole-transport layer comprises a first organic compound and an anti-reducing substance,
    wherein the first light-emitting substance is the same as the second light-emitting substance, and
    wherein a concentration of the second light-emitting substance is higher than a concentration of the third light-emitting substance, and the concentration of the third light-emitting substance is higher than a concentration of the first light-emitting substance.

2. A light-emitting element comprising:
a first electrode;
a second electrode;
a hole-transport layer between the first electrode and the second electrode;
an electron-transport layer between the first electrode and the second electrode; and
a light-emitting layer between the hole-transport layer and the electron-transport layer,
wherein the light-emitting layer comprises:
 a first light-emitting layer comprising a first light-emitting substance and being in contact with the hole-transport layer;
 a second light-emitting layer comprising a second light-emitting substance and being in contact with the first light-emitting layer; and
 a third light-emitting layer comprising a third light-emitting substance and being in contact with the second light-emitting layer and the electron-transport layer,
wherein the first light-emitting layer and the second light-emitting layer are bipolar,
wherein the hole-transport layer comprises a first organic compound and an anti-reducing substance,
wherein the first light-emitting substance is the same as the second light-emitting substance, and
wherein a HOMO level (highest occupied molecular orbital level) of the third light-emitting substance is equal to a HOMO level of the electron-transport layer.
wherein a concentration of the second light-emitting substance is higher than a concentration of the third light-emitting substance, and the concentration of the third light-emitting substance is higher than a concentration of the first light-emitting substance.

3. A light-emitting element comprising:
a first electrode;
a second electrode;
a hole-transport layer between the first electrode and the second electrode;
an electron-transport layer between the first electrode and the second electrode; and
a light-emitting layer between the hole-transport layer and the electron-transport layer,
wherein the light-emitting layer comprises:
 a first light-emitting layer comprising a first light-emitting substance and being in contact with the hole-transport layer; and
 a second light-emitting layer comprising a second light-emitting substance and being in contact with the first light-emitting layer,
 a third light-emitting layer comprising a third light-emitting substance and being in contact with the second light-emitting layer and the electron-transport layer,
wherein the first light-emitting layer and the second light-emitting layer are bipolar,
wherein the hole-transport layer comprises a first organic compound and a metal oxide,
wherein the first light-emitting substance is the same as the second light-emitting substance, and
wherein a HOMO level (highest occupied molecular orbital level) of the third light-emitting substance is equal to a HOMO level of the electron-transport layer.
wherein a concentration of the second light-emitting substance is higher than a concentration of the third light-emitting substance, and the concentration of the third light-emitting substance is higher than a concentration of the first light-emitting substance.

4. A light-emitting element comprising:
a first electrode;
a second electrode;
a hole-transport layer between the first electrode and the second electrode;
an electron-transport layer between the first electrode and the second electrode;
a light-emitting layer between the hole-transport layer and the electron-transport layer,
wherein the light-emitting layer comprises:
 a first light-emitting layer comprising a first light-emitting substance and being in contact with the hole-transport layer; and
 a second light-emitting layer comprising a second light-emitting substance and being in contact with the first light-emitting layer,
 a third light-emitting layer comprising a third light-emitting substance and being in contact with the second light-emitting layer and the electron-transport layer,
wherein the hole-transport layer comprises a first organic compound and an anti-reducing substance,
wherein the first light-emitting substance is the same as the second light-emitting substance, and
wherein a HOMO level (highest occupied molecular orbital level) of the third light-emitting substance is equal to a HOMO level of the electron-transport layer.
wherein a concentration of the second light-emitting substance is higher than a concentration of the third light-emitting substance, and the concentration of the third light-emitting substance is higher than a concentration of the first light-emitting substance.

5. The light-emitting element according to claim 2,
wherein the third light-emitting layer has an electron-transport property.

6. The light-emitting element according to claim 2,
wherein the first light-emitting layer further comprises a first host material,
wherein the second light-emitting layer further comprises a second host material,
wherein the third light-emitting layer further comprises a third host material, and
wherein a HOMO level (highest occupied molecular orbital level) of the third host material is deeper than a HOMO level of the second host material.

7. The light-emitting element according to claim 2,
wherein the third light-emitting layer further comprises a host material, and
wherein a HOMO level of the third light-emitting substance is shallower than a HOMO level of the host material.

8. The light-emitting element according to claim 2 or 4,
wherein the anti-reducing substance is a metal oxide.

9. The light-emitting element according to claim 1,
wherein the anti-reducing substance is a metal oxide.

10. The light-emitting element according to any one of claims 1, 2, and 4,
wherein the first light-emitting layer further comprises a first host material,
wherein the anti-reducing substance is a second organic compound,
wherein a LUMO level (lowest unoccupied molecular orbital level) of the second organic compound is shallower than a LUMO level of the first host material, wherein a band gap of the second organic compound is wider than a band gap of the first light-emitting substance, and wherein a HOMO level of the second organic compound is deeper than a HOMO level of the first organic compound.

11. The light-emitting element according to any one of claims 2, 3, and 4, wherein a hole-transport property of the first light-emitting layer is higher than a hole-transport property of the second light-emitting layer.

12. The light-emitting element according to any one of claims 1, 2, 3, and 4, wherein the first light-emitting layer further comprises a first host material, wherein the second light-emitting layer further comprises a second host material, wherein a difference between a HOMO level of the first light-emitting substance and a HOMO level of the second light-emitting substance is less than or equal to 0.2 eV, wherein a difference between a HOMO level of the second host material and a HOMO level of the first host material is less than or equal to 0.2 eV, and wherein the HOMO level of the first light-emitting substance is shallower than the HOMO level of the first host material.

13. The light-emitting element according to any one of claims 1, 2, 3, and 4, wherein the first light-emitting layer further comprises a first host material, wherein the second light-emitting layer further comprises a second host material, and wherein the first host material and the second host material are the same.

14. The light-emitting element according to any one of claims 1, 2, 3, and 4, wherein the first electrode serves as an anode, and wherein the hole-transport layer is in direct contact with the anode.

15. The light-emitting element according to any one of claims 1, 2, 3, and 4, wherein the hole-transport layer is in contact with the first electrode.

16. A lighting device to which the light-emitting element according to any one of claims 1, 2, 3, and 4 is applied.

17. An electronic device to which the light-emitting element according to any one of claims 1, 2, 3, and 4 is applied, wherein the electronic device is one selected from the group consisting of a camera, goggle type display, a navigation system, an audio reproducing device, a computer, a game machine, a portable information terminal, an image reproducing device, and television.

* * * * *

UNITED STATES PATENT AND TRADEMARK OFFICE
CERTIFICATE OF CORRECTION

PATENT NO. : 9,741,955 B2
APPLICATION NO. : 12/788004
DATED : August 22, 2017
INVENTOR(S) : Satoko Shitagaki et al.

It is certified that error appears in the above-identified patent and that said Letters Patent is hereby corrected as shown below:

In the Specification

Column 11, Line 50; Change "N-phenylamino]" to --N'-phenylamino]--.

In the Claims

Column 39, Lines 28 thru 32, Claim 2; Change "the second light-emitting substance, and wherein a HOMO level (highest occupied molecular orbital level) of the third light-emitting substance is equal to a HOMO level of the electron-transport layer, wherein a concentration of the second light-emitting" to --the second light-emitting substance, and wherein a concentration of the second light-emitting--.

Column 39, Lines 62 thru 66, Claim 3; Change "the second light-emitting substance, and wherein a HOMO level (highest occupied molecular orbital level) of the third light-emitting substance is equal to a HOMO level of the electron-transport layer, wherein a concentration of the second light-emitting" to --the second light-emitting substance, and wherein a concentration of the second light-emitting--.

Column 40, Lines 27 thru 31, Claim 4; Change "the second light-emitting substance, and wherein a HOMO level (highest occupied molecular orbital level) of the third light-emitting substance is equal to a HOMO level of the electron-transport layer, wherein a concentration of the second light-emitting" to --the second light-emitting substance, and wherein a concentration of the second light-emitting--.

Signed and Sealed this
Fourteenth Day of November, 2017

Joseph Matal
*Performing the Functions and Duties of the
Under Secretary of Commerce for Intellectual Property and
Director of the United States Patent and Trademark Office*